(12) United States Patent
Lee et al.

(10) Patent No.: US 11,893,911 B2
(45) Date of Patent: Feb. 6, 2024

(54) DISPLAY DEVICE AND APPARATUS AND METHOD FOR MANUFACTURING THE DISPLAY DEVICE

(71) Applicant: Samsung Display Co., LTD., Yongin-si (KR)

(72) Inventors: Jung Min Lee, Suwon-si (KR); Dong Woo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 368 days.

(21) Appl. No.: 17/179,394

(22) Filed: Feb. 18, 2021

(65) Prior Publication Data
US 2021/0358345 A1    Nov. 18, 2021

(30) Foreign Application Priority Data
May 13, 2020 (KR) .......................... 10-2020-0056922

(51) Int. Cl.
| | | |
|---|---|---|
| *G09F 9/00* | (2006.01) | |
| *G09F 9/30* | (2006.01) | |
| *H05K 1/02* | (2006.01) | |
| *H10K 50/84* | (2023.01) | |
| *H10K 71/00* | (2023.01) | |

(52) U.S. Cl.
CPC ............. *G09F 9/301* (2013.01); *H05K 1/028* (2013.01); *H10K 50/841* (2023.02); *H10K 71/00* (2023.02); *H05K 2201/10128* (2013.01)

(58) Field of Classification Search
CPC ...... G09F 9/301; H10K 50/841; H10K 71/00; H05K 1/028; H05K 2201/10128
See application file for complete search history.

(56) References Cited

U.S. PATENT DOCUMENTS

| | | | |
|---|---|---|---|
| 2013/0002583 A1* | 1/2013 | Jin | G06F 3/041 |
| | | | 313/511 |
| 2020/0174526 A1* | 6/2020 | Jeong | G06F 1/1626 |
| 2020/0196496 A1* | 6/2020 | Shin | H05K 7/20963 |
| 2020/0401197 A1* | 12/2020 | Asada | H05K 1/118 |

FOREIGN PATENT DOCUMENTS

| | | | |
|---|---|---|---|
| KR | 2009-0107720 | 10/2009 | |
| KR | 2014-0121998 | 10/2014 | |
| KR | 2015-0061769 | 6/2015 | |
| WO | WO-2021184331 A1 * | 9/2021 | ........... H01L 27/323 |

* cited by examiner

*Primary Examiner* — Pete T Lee
(74) *Attorney, Agent, or Firm* — H.C. Park & Associates, PLC

(57) ABSTRACT

A display device includes: a display panel including a main portion, a bending portion extending from a side of the main portion, and a sub portion extending from a side of the bending portion; a driving board connected to a side of the sub portion and overlapping the main portion of the display panel in a thickness direction; and a protective member disposed between the display panel and the driving board, wherein the sub portion is folded with respect to the bending portion and attached to a back surface of the main portion.

8 Claims, 18 Drawing Sheets

200: 210, 220

DISPLAY DEVICE AND APPARATUS AND METHOD FOR MANUFACTURING THE DISPLAY DEVICE

CROSS REFERENCE TO RELATED APPLICATION

This application claims priority from and the benefit of Korean Patent Application No. 10-2020-0056922, filed on, which is hereby incorporated by reference for all purposes as if fully set forth herein.

BACKGROUND

Field

Embodiments of the invention relate generally to a display device and an apparatus and method for manufacturing the display device and, more specifically, to a display device having a curved display panel and an apparatus and method for manufacturing the display device having the curved display panel.

Discussion of the Background

A display device is a device that displays an image and includes a display panel such as a liquid crystal display panel or an organic light emitting display panel including organic light emitting diodes (OLEDs) or quantum dot electroluminescence (QD-EL) devices.

As display devices are applied to various electronic devices, display devices having various designs are required. For example, research is being conducted on a display device in which an edge portion of a display panel is bent to display an image not only on a front portion but also on side portions extending from the front portion.

A flexible printed circuit board on which electronic parts for controlling, e.g., a touch panel are mounted may be attached to the display panel of such a display device.

The above information disclosed in this Background section is only for understanding of the background of the inventive concepts, and, therefore, it may contain information that does not constitute prior art.

SUMMARY

Applicant has discovered that when a curved display panel including a display device is manufactured, a distance between a bent portion of the display panel and another portion of the display panel may not be constant, and the bending portion of the display panel can be easily damaged or deformed.

Display devices having a curved display panel, an apparatus and a method for manufacturing the display devices having the curved display according to embodiments of the invention are capable of maintaining a constant distance between a bent portion of the curved display panel and another portion of the curved display panel.

Display devices having a curved display panel, an apparatus and a method for manufacturing the display devices having the curved display according to embodiments of the invention are capable of reducing stress applied to a flexible circuit board attached to the curved display panel.

Additional features of the inventive concepts will be set forth in the description which follows, and in part will be apparent from the description, or may be learned by practice of the inventive concepts.

According to an aspect of the invention, a display device includes: a display panel including a main portion, a bending portion extending from a side of the main portion, and a sub portion extending from a side of the bending portion; a driving board connected to a side of the sub portion and overlapping the main portion of the display panel in a thickness direction; and a protective member disposed between the display panel and the driving board, wherein the sub portion is folded with respect to the bending portion and attached to a back surface of the main portion.

The main portion may include a flat main portion and a curved main portion extending from a side of the flat main portion, and the protective member may be disposed on the flat main portion and the curved main portion.

The sub portion may include a flat sub portion and a curved sub portion extending from a side of the flat sub portion, and the protective member may be disposed between the flat main portion and the flat sub portion and between the curved main portion and the curved sub portion.

The protective member may be bent so that a portion of the protective member overlaps another portion of the protective member in the thickness direction.

The protective member may form a double layer on the curved main portion.

The protective member may include a protective film, a first adhesive member disposed on a surface of the protective film, and a second adhesive member disposed on the other surface of the protective film.

The display device may include: a main display surface; and a sub display surface inclined to the main display surface, wherein a flat main portion of the main portion may be disposed on the main display surface, and a curved main portion of the main portion is disposed on the sub display surface.

The display panel may include a base substrate, an active element layer, and a thin-film encapsulation layer.

According to another aspect of the invention, an apparatus for manufacturing a display device includes: a stage including an upper surface on which a portion of a target object is mounted; a support unit disposed on a side of the stage at an angle to the stage and including a side surface on which another portion of the target object is mounted; and a pressing unit on which a protective member is mounted, the pressing unit configured to move toward the target object and to press the protective member against the target object.

The support unit may include a first suction unit configured to move into close contact with the another portion of the target object and a second suction unit disposed between the first suction unit and the stage.

The first suction unit may include a vacuum pad.

The second suction unit may be configured to stretch or shorten to vary a distance from the target object.

The second suction unit may include a link portion configured to stretch or shorten in one direction and a pad portion disposed at an end of the link portion.

The pressing unit may include a first flat surface disposed on a side facing the target object, a second flat surface inclined to the first flat surface, and a curved surface connecting the first flat surface and the second flat surface.

The apparatus may include a controller configured to control at least one of the stage, the support unit, and the pressing unit, wherein the controller may be configured to control movement and rotation of the pressing unit based on pre-stored dimension information of the target object.

The apparatus may include a camera configured to photograph the target object, wherein the controller may be configured to calculate a difference in height between a side and the other side of the target object based on information obtained from the camera and to determine whether the protective member has been attached in a correct position.

The angle between the stage and the support unit may be about 45 to 135 degrees.

A side of the target object may be bent so that the target object has an 'L'-shaped cross section.

The target object may include a target substrate and a flexible film, at least a portion of the target substrate may be mounted on the stage, and at least a portion of the flexible film may be mounted on the support unit.

According to another aspect of the invention, an apparatus for manufacturing a display device includes: a stage including an upper surface on which a portion of a target object is mounted; a support unit disposed on a side of the stage at an angle to the stage and including a side surface on which another portion of the target object is mounted; and a coating unit configured to move toward the target object and to coat the target object with a coating agent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a portion of this specification, illustrate embodiments of the invention, and together with the description serve to explain the inventive concepts.

DETAILED DESCRIPTION

Figure 1:
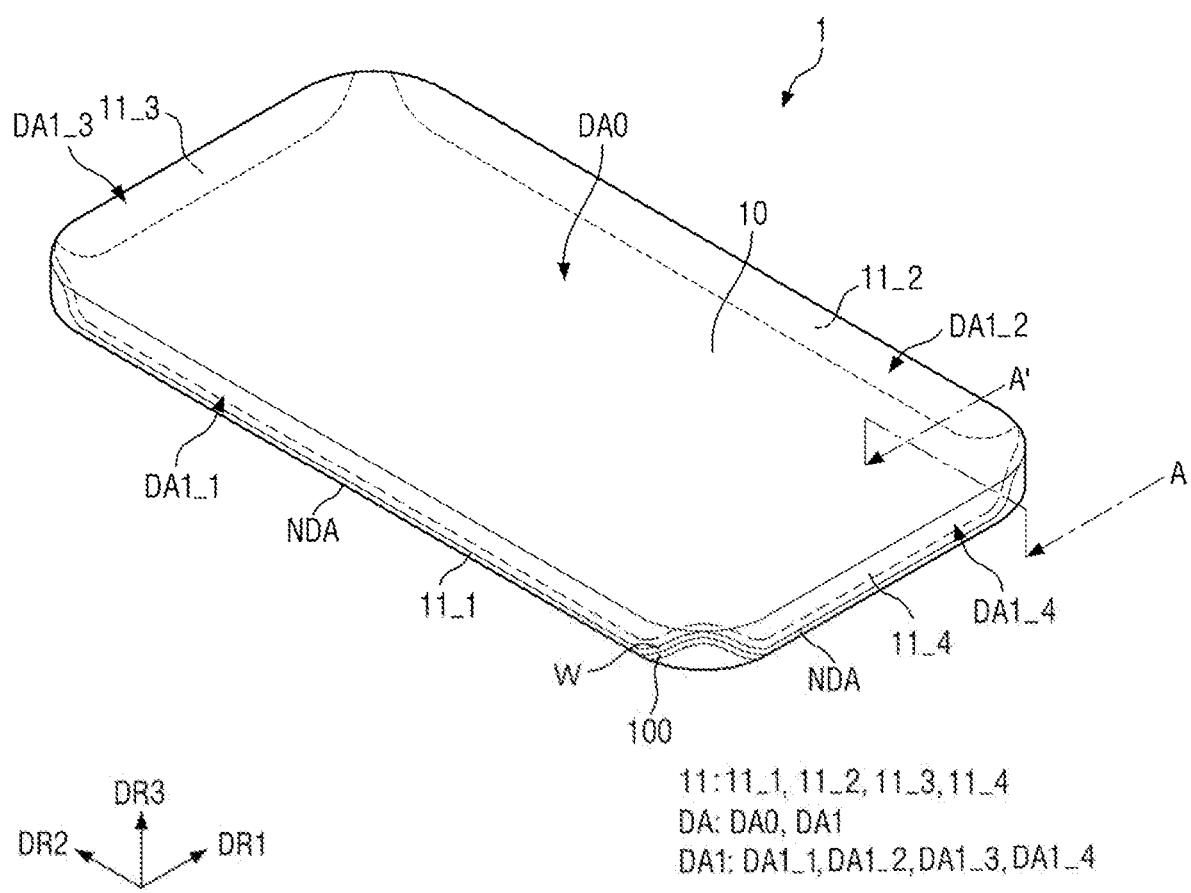
FIG. 1 is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

Hereinafter, specific embodiments will be described with reference to the attached drawings.

Figure 2:
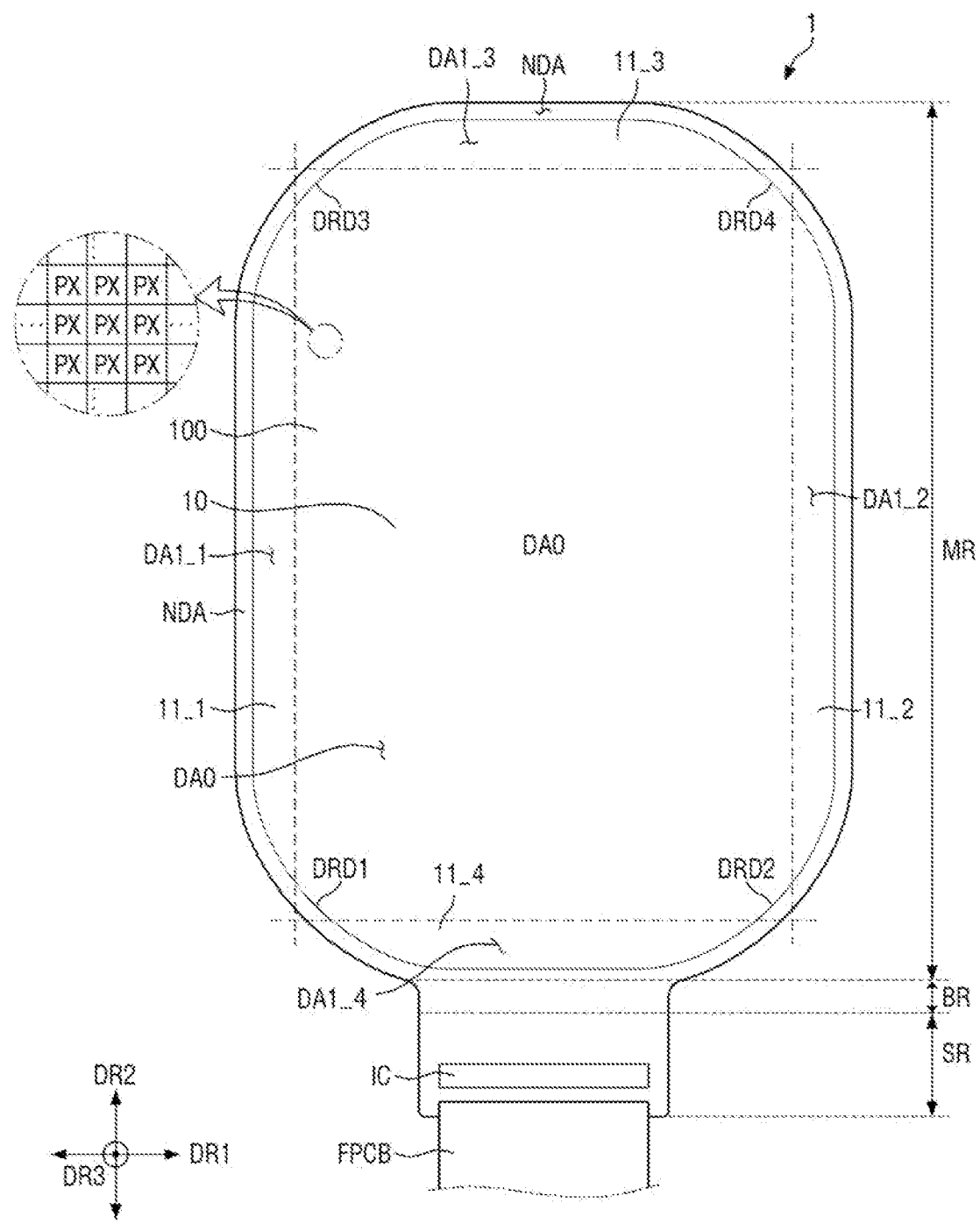
FIG. 2 is a plan view of a display panel and a driving board of the display device of FIG. 1 in an unfolded state.

FIG. 1 is a perspective view of an embodiment of a display device 1 constructed according to the principles of the invention. FIG. 2 is a plan view of a display panel 100 and a driving board FPCB of the display device 1 of FIG. 1 in an unfolded state.

In the following description, a first direction DR1, a second direction DR2, and a third direction DR3 intersect each other in different directions. The first direction DR1 may be a length direction, the second direction DR2 may be a width direction, and the third direction DR3 may be a thickness direction. The third direction DR3 may include an upward direction toward an upper side in the drawings and a downward direction toward a lower side in the drawings. Accordingly, a surface of a member disposed to face the upward direction may be referred to as an upper surface, and the other surface of the member disposed to face the downward direction may be referred to as a lower surface. However, the above directions should be understood as relative directions, and embodiments are not limited to the above example.

Examples of the display device 1 according to the embodiment may include various devices that display a screen or an image. For example, examples of the display device 1 may include, but are not limited to, smartphones, mobile phones, tablet personal computers (PCs), personal digital assistants (PDAs), portable multimedia players (PMPs), televisions, game machines, wristwatch-type electronic devices, head mounted displays, monitors of PCs, notebook computers, car navigation systems, car dashboards, digital cameras, camcorders, external billboards, electronic boards, various medical devices, various examination devices, various home appliances including a display portion DPA, such as refrigerators and washing machines, and Internet of things (IoT) devices.

Referring to FIGS. 1 and 2, the display device 1 may have a rectangular shape in a plan view. In an embodiment, the display device 1 may have both long sides extending in the second direction DR2 and both short sides extending the first direction DR1 intersecting the second direction DR2 in a plan view, and corners of the display device 1 may have a convex outward curvature. However, embodiments are not limited thereto, and the display device 1 may also have various shapes.

The display device 1 includes a main display surface 10 and a plurality of sub display surfaces 11 (e.g., 11_1, 11_2, 11_3, and 11_4).

The main display surface 10 may be disposed on a surface of the display device 1. The surface of the display device 1 may be an upper surface of the display device 1. The main display surface 10 may have a rectangular shape in a plan view. A size of the main display surface 10 may be larger than that of each of the sub display surfaces 11. The main display surface 10 may be a flat surface. In some embodiments, the main display surface 10 may include a curved surface.

The sub display surfaces 11 are disposed in a plane different from the plane in which the main display surface 10 is located. The size of each of the sub display surfaces 11 may be smaller than that of the main display surface 10. In an embodiment, the sub display surfaces 11 may be disposed on side surfaces between upper and lower surfaces of the display device 1. For example, the display device 1 may be a multi-faceted display device or a three-dimensional display device that displays an image in at least two directions. The sub display surfaces 11 may be connected to the main display surface 10. In detail, the sub display surfaces 11 may be connected to edges of the main display surface 10 so that the main display surface 10 and the sub display surfaces 11 form one display surface having a curved portion. For example, the sub display surfaces 11 may correspond to the curved portion. A width of each of the sub display surfaces 11 (e.g., 11_1, 11_2, 11_3, and 11_4) may become reduced toward corners of the main display surface 10. An edge of each of the sub display surfaces 11 may include a straight edge portion and curved edge portions. For example, the straight edge portion may be disposed or interposed between the curved edge portions. In an embodiment, each of the sub display surfaces 11 may be bent to have a convex upward curvature, but embodiments are not limited thereto.

The sub display surfaces 11 may include a first sub display surface 11_1, a second sub display surface 11_2, a third sub display surface 11_3, and a fourth sub display surface 11_4.

The first sub display surface 11_1, the second sub display surface 11_2, the third sub display surface 11_3, and the fourth sub display surface 11_4 may be disposed on four sides of the main display surface 10, respectively. The first sub display surface 11_1, the second sub display surface 11_2, the third sub display surface 11_3, and the fourth sub display surface 11_4 may surround at least a portion of the main display surface 10. The first sub display surface 11_1, the second sub display surface 11_2, the third sub display surface 11_3, and the fourth sub display surface 11_4 may be disposed symmetrically with respect to the main display surface 10. For example, the first sub display surface 11_1 and the second sub display surface 11_2 may be disposed symmetrically to each other (e.g., about a second axis of the second direction DR2), and the third sub display surface 11_3 and the fourth sub display surface 11_4 may be disposed symmetrically to each other (e.g., about a first axis of the first direction DR1). The shapes and arrangements of the first sub display surface 11_1, the second sub display surface 11_2, the third sub display surface 11_3, and the fourth sub display surface 11_4 may be substantially the same or similar. The first sub display surface 11_1, the second sub display surface 11_2, the third sub display surface 11_3, and the fourth sub display surface 11_4 may be the sub display surfaces 11 disposed in a left portion, a right portion, an upper portion, and a lower portion of the display device 1 of FIG. 1, respectively. In some embodiments, the sub display surfaces 11 may include only some of the first sub display surface 11_1, the second sub display surface 11_2, the third sub display surface 11_3, and the fourth sub display surface 11_4

The display device 1 includes a display area DA and a non-display area NDA.

The display area DA displays an image. The display area DA may include a main display area DA0 and a plurality of sub display areas DA1 (e.g., DA1_1, DA1_2, DA1_3, and DA1_4).

The main display area DA0 is disposed on the main display surface 10. The sub areas DA1 (e.g., DA1_1, DA1_2, DA1_3, and DA1_4) are disposed on the sub display surfaces 11 (e.g., 11_1, 11_2, 11_3, and 11_4), respectively. The main display area DA0 and the sub display areas DA1 may be connected to form one area. In an embodiment, the main display area DA0 may be disposed only on the main display surface 10, and the sub display areas DA1 may be disposed only on the sub display surfaces 11, but embodiments are not limited thereto.

The sub display areas DA1 may include a first sub display area DA1_1, a second sub display area DA1_2, a third sub display area DA1_3, and a fourth sub display area DA1_4.

The first sub display area DA1_1, the second sub display area DA1_2, the third sub display area DA1_3, and the fourth sub display area DA1_4 may be disposed on the first sub display surface 11_1, the second sub display surface 11_2, the third sub display surface 11_3, and the fourth sub display surface 11_4, respectively. The first sub display area DA1_1, the second sub display area DA1_2, the third sub display area DA1_3, and the fourth sub display area DA1_4 may be separated from each other, or at least two or more of them may be connected to each other. In an embodiment, the first sub display area DA1_1, the second sub display area DA1_2, the third sub display area DA1_3, and the fourth sub display area DA1_4 may be separated from each other and may each be connected to the main display area DA0. For example, the first sub display area DA1_1, the second sub display area DA1_2, the third sub display area DA1_3, the fourth sub display area DA1_4, and the main display area DA0 may form one area, but embodiments are not limited thereto.

The non-display area NDA is disposed around the display area DA. The non-display area NDA may not display an image. The non-display area NDA may be an area other than the display area DA. In an embodiment, the non-display area NDA may have a band shape extending along outermost edges of the main display surface 10 and the sub display surfaces 11. Signal wirings or driving circuits for transmitting signals to the display area DA may be disposed in the non-display area NDA.

The display device 1 may include the display panel 100 and the driving board FPCB.

The display panel 100 provides a display screen. Examples of the display panel 100 include organic light emitting display panels, micro-light emitting diode (LED) display panels, nano-LED display panels, quantum dot light emitting display panels, liquid crystal display panels, plasma display panels, field emission display panels, electrophoretic display panels, electrowetting display panels, and the like. An organic light emitting display panel will hereinafter be described as an example of the display panel 100. However, embodiments are not limited thereto, and other display panels are also applicable.

The display panel 100 may include a main portion MR, a bending portion BR, and a sub portion SR.

The main portion MR may have a rectangular shape with rounded corners in a plan view. The main portion MR may have both short sides extending in the first direction DR1 and both long sides extending in the second direction DR2, but embodiments are not limited thereto. The display area DA may be located in the main portion MR. A size of the main portion MR may be larger than those of the bending portion BR and the sub portion SR.

The main portion MR may include a first round portion DRD1, a second round portion DRD2, a third round portion DRD3, and a fourth round portion DRD4.

The first round portion DRD1, the second round portion DRD2, the third round portion DRD3, and the fourth round portion DRD4 may be disposed at four corners of the main portion MR, respectively. In an embodiment, the first round portion DRD1, the second round portion DRD2, the third round portion DRD3, and the fourth round portion DRD4 may be disposed at four corners of the main display surface 10, respectively.

Each of the first round portion DRD1, the second round portion DRD2, the third round portion DRD3, and the fourth round portion DRD4 may be disposed between neighboring sub display surfaces 11 (e.g., between neighboring sub display areas DA1). For example, the first round portion DRD1 may be disposed between the first sub display surface 11_1 and the fourth sub display surface 11_4 (e.g., between the first sub display area DA1_1 and the fourth sub display area DA1_4). A side of the first round portion DRD1 may be connected to an edge of the first sub display surface 11_1, and the other side of the first round portion DRD1 may be connected to an edge of the fourth sub display surface 11_4. In some embodiments, for example, the first round portion DRD1 may be disposed on the first sub display surface 11_1, the main display surface 10 and the fourth sub display surface 11_4 (e.g., on the first sub display area DA1_1, the main display area DA0 and the fourth sub display area DA1_4). For example, the edges of the main display surface 10 and the edges of the sub display surfaces 11 disposed adjacent to each other at the corners of the main portion MR may form the round portions of the main portion MR.

The first, second, third, and fourth round portions DRD1, DRD2, DRD3, and DRD4 may have substantially the same curvature or have different curvatures. Alternatively, at least two of the first, second, third, and fourth round portions DRD1, DRD2, DRD3, and DRD4 may have substantially the same curvature. In addition, each of the first, second, third, and fourth round portions DRD1, DRD2, DRD3, and DRD4 may have a substantially constant curvature or a varying curvature.

Figure 3:
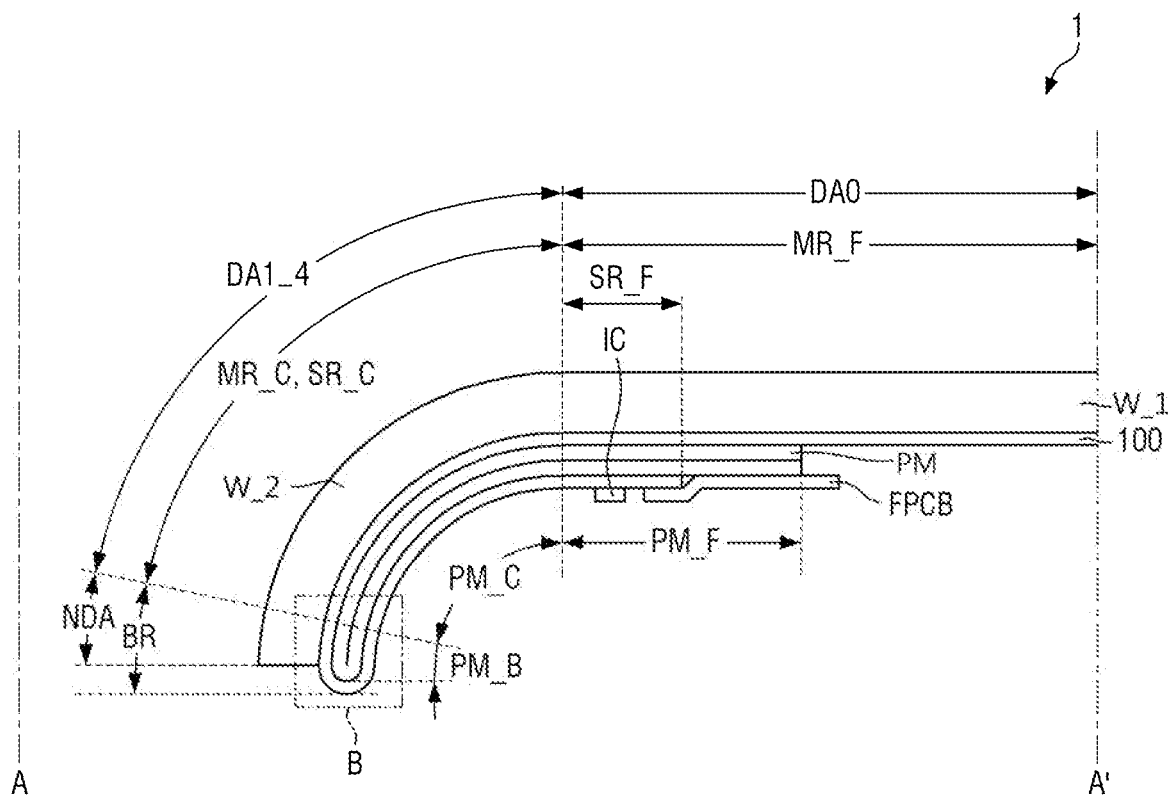
FIG. 3 is a cross-sectional view taken along A-A' of FIG. 1.
Figure 3:
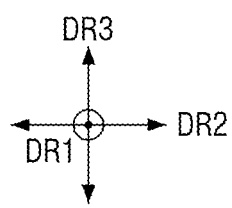

The bending portion BR may be connected to a side of the main portion MR. In an embodiment, the bending portion BR may be connected to a side of the main portion MR in the second direction DR2. In detail, the bending portion BR may be connected to the main portion MR disposed on the fourth sub display surface 11_4. As illustrated in FIG. 3, the bending portion BR may be bent in a 'U' or 'C' shape so that the sub portion SR is inverted or folded with respect to the bending portion BR and thus overlapped by the main portion MR in the thickness direction (e.g., the third direction DR3).

The sub portion SR extends from the bending portion BR. A pad portion may be disposed on the display panel 100 in the sub portion SR. A driving chip IC may be mounted on (or attached to) the pad portion 222_1. The driving chip IC may include an integrated circuit that drives the display panel 100. In an embodiment, the integrated circuit may be a data driving integrated circuit that generates and provides a data signal. However, embodiments are not limited thereto. In addition, the pad portion 222_1 may further include a signal wiring pad and a touch signal wiring pad for the display panel 100. As illustrated in FIG. 3, the sub portion SR may be inverted or folded with respect to the bending portion BR and thus overlapped by the main portion MR in the thickness direction.

At least a portion of the sub portion SR may be bent according to the shape of the sub display surfaces 11 bent to have a predetermined curvature.

The driving board FPCB may have a rectangular shape in a plan view. However, embodiments are not limited thereto. The driving board FPCB may be connected to an end of the sub portion SR. In an embodiment, the driving board FPCB may be connected to an end of the sub portion SR in the second direction DR2. The driving board FPCB may include a flexible printed circuit board or a flexible printed circuit film. In some embodiments, the driving board FPCB may be connected to a base substrate SUB at a plurality of points.

The cross-sectional configuration of the display device 1 according to the embodiment will now be described with reference to FIGS. 3 and 4.

FIG. 3 is a cross-sectional view taken along A-A' of FIG. 1. FIG. 4 is an enlarged cross-sectional view of portion 'B' of FIG. 3.

Referring to FIGS. 1, 2, 3, and 4, an edge portion of the display panel 100 may be bent to have a convex outward curvature in cross sectional view.

The main portion MR of the display panel 100 may include a flat portion MR_F and a curved portion MR_C.

The flat portion MR_F of the main portion MR is disposed in the main display area DA0.

The curved portion MR_C of the main portion MR is disposed in a sub display area DA1. For example, the curved portion MR_C of the main portion MR may be disposed in the fourth sub display area DA1_4. The curved portion MR_C of the main portion MR may extend from a side of the flat portion MR_F. The curved portion MR_C of the main portion MR may be bent in the third direction DR3 to have a convex upward curvature.

The display area DA of the display device 1 may be disposed on the flat portion MR_F and the curved portion MR_C of the main portion MR. The display area DA of the display device 1 may be disposed on at least a portion of the flat portion MR_F and at least a portion of the curved portion MR_C of the main portion MR.

The sub portion SR may be attached to at least a portion of the main portion MR. The sub portion SR may have a shape corresponding to the shape of the main portion MR in cross sectional view.

The sub portion SR of the display panel 100 may include a flat portion SR_F and a curved portion SR_C.

The flat portion SR_F of the sub portion SR is disposed in the main display area DA0. At least a portion of the flat portion SR_F of the sub portion SR may be attached to a lower surface of the flat portion MR_F of the main portion MR by a protective member PM which will be described later.

The curved portion SR_C of the sub portion SR is disposed in the fourth sub display area DA1_4. The curved portion SR_C of the sub portion SR may extend from a side of the flat portion SR_F of the sub portion SR. The curved portion SR_C of the sub portion SR may be bent in the thickness direction to have a convex upward curvature. At least a portion of the curved portion SR_C of the sub portion SR may be attached to a lower surface of the curved portion MR_C of the main portion MR by the protective member PM which will be described later.

The cross-sectional shapes of the curved portion MR_C of the main portion MR and the curved portion SR_C of the sub area SR may correspond to the shape of a curved portion W_2 of a window substrate W which will be described later. For example, the cross-sectional shapes of the curved portion MR_C of the main portion MR and the curved portion SR_C of the sub portion SR may be bent according to the shape of the curved portion W_2 of the window substrate W.

Figure 4:
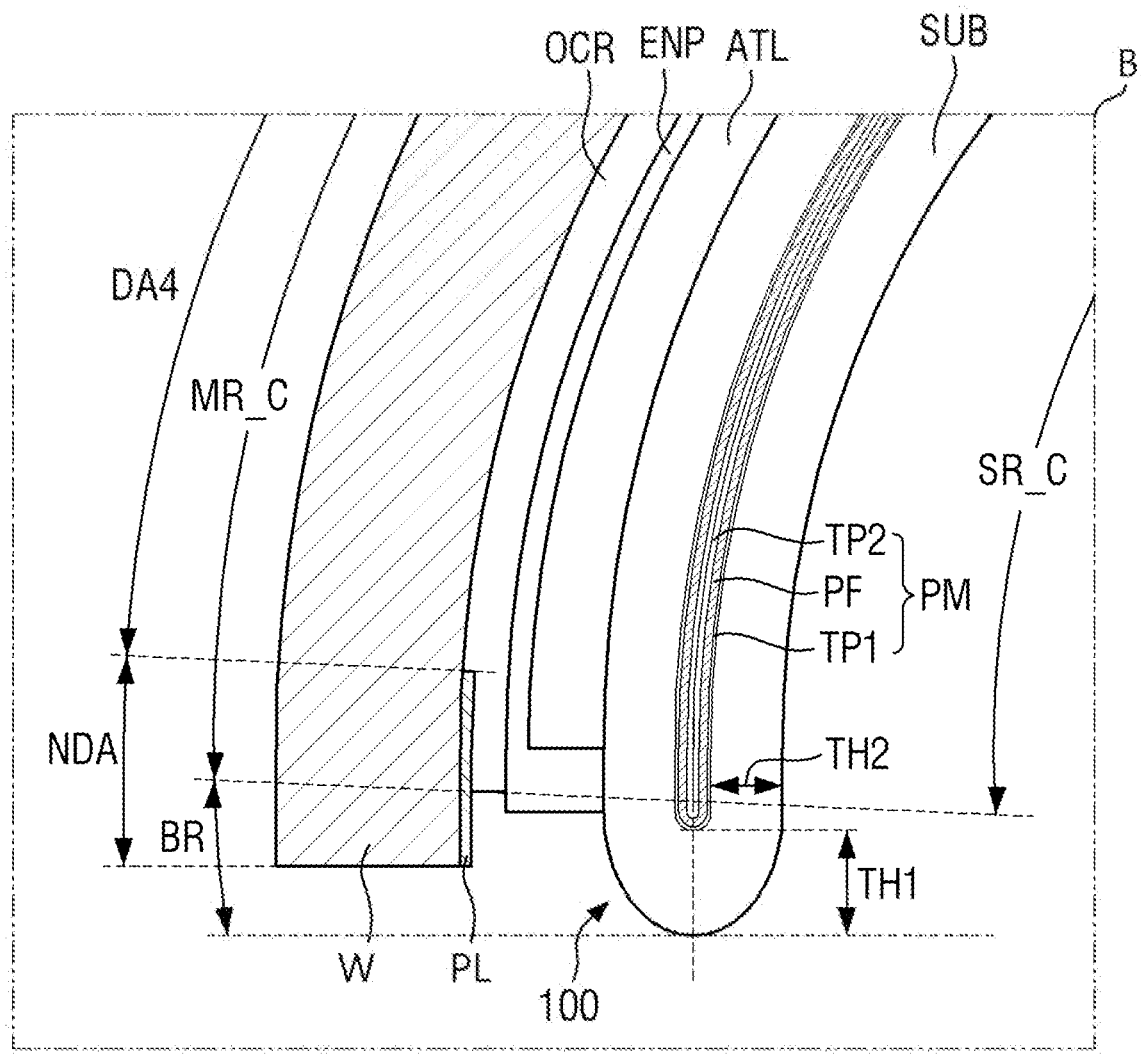
FIG. 4 is an enlarged cross-sectional view of portion 'B' of FIG. 3.

Referring to FIG. 4, a thickness TH1 of the base substrate SUB located in the bending portion BR may be greater than a thickness TH2 of the base substrate SUB located in other portions. In other words, the thickness TH1 of the base substrate SUB located in the bending portion BR may be greater than the thickness TH2 of the base substrate SUB located in the main portion MR and the sub portion SR. The thickness TH1 of the base substrate SUB located in the bending portion BR may be about 1.5 to 4 or more times the thickness TH2 of the base substrate SUB located in other portions. However, embodiments are not limited thereto.

Referring to FIGS. 3 and 4, the display panel 100 may include the base substrate SUB, an active element layer ATL, and a thin-film encapsulation layer ENP.

The base substrate SUB may be disposed in the main portion MR, the bending portion BR, and the sub portion SR. The base substrate SUB may include a flexible polymer material such as polyimide. Accordingly, the base substrate SUB can be bent, curved, folded, and rolled. For example, the base substrate SUB may include a flexible substrate. As illustrated in FIG. 3, a portion of the base substrate SUB disposed in the sub portion SR may be inverted or folded with respect to the bending portion BR and thus overlapped in the thickness direction by another portion of the base substrate SUB disposed in the main portion MR. The driving board FPCB may be connected to a side of the base substrate SUB disposed in the sub portion SR.

The active element layer ATL is disposed on a surface of the base substrate SUB which faces the window substrate W. The active element layer ATL may emit light that enables the display device 1 to display a screen. The active element layer ATL may include light emitting elements which emit light and thin-film transistors which drive the light emitting elements. The active element layer ATL may be disposed in the main portion MR. However, embodiments are not limited thereto, and the active element layer ATL may also be disposed in the bending portion BR and/or the sub portion SR.

The thin-film encapsulation layer ENP may be disposed on the active element layer ATL. The thin-film encapsulation layer ENP may cover the active element layer ATL to prevent the active element layer ATL from being exposed to moisture or air.

Referring to FIGS. 1, 3 and 4, the display device 1 may further include a window member 200.

The window member 200 may be disposed on the display panel 100. The window member 200 covers and protects the display panel 100.

The window member 200 may include the window substrate W and a print layer PL disposed on the window substrate W.

The window substrate W may be made of a transparent material. The window substrate W may include, for example, glass or plastic. When the window substrate W includes plastic, the window substrate W may have flexible properties. The window substrate W may have a shape corresponding to the shape of the display panel 100. For example, the window substrate W may be curved or bended according to the shape of the display panel 100.

The window substrate W may include a flat portion W_1 and the curved portion W_2. The flat portion W_1 is a generally flat area, and the planar shape of the flat portion W_1 corresponds to the planar shape of the display device 1 to which the window substrate W is applied. The curved portion W_2 may protrude outward from all sides (e.g., four sides in the drawings) of the display panel 100. In other words, the window substrate W may be greater than the display panel 100 in a plan view, and the curved portion W_2 may extend from the flat portion W_1 and protrude from side surfaces of the display panel 100. The curved portion W_2 may be bent in the third direction DR3.

The print layer PL may be disposed on the window substrate W. The print layer PL may be disposed on a surface and/or the other surface of the window substrate W. The print layer PL may be disposed on an edge portion of the window substrate W and may be disposed in a non-active area NAR. The print layer PL may be a light blocking layer or a decorative layer that provides an aesthetic effect.

The display device 1 may further include a transparent bonding layer OCR.

The transparent bonding layer OCR attaches the window substrate W onto a surface of the display panel 100. The transparent bonding layer OCR may include an optically clear adhesive or an optically clear resin.

For example, the display device 1 may further include a touch layer and a polarizing member. The touch layer may be disposed on the thin-film encapsulation layer ENP. The touch layer may include a plurality of touch electrodes. The touch electrodes may have a mesh shape. The touch layer can be omitted.

The polarizing member may be disposed on the display panel 100. The polarizing member polarizes light that passes therethrough. The polarizing member may reduce reflection of external light.

For example, a cover panel may be disposed on the other surface of the base substrate SUB. The cover panel may include a heat dissipation layer, a cushion layer, etc. In this case, the driving board FPCB located at an end of the base substrate SUB may be bonded or attached and fixed to the cover panel.

Referring to FIGS. 3 and 4, the display device 1 may further include the protective member PM.

The protective member PM may be disposed on the display panel 100 and the driving board FPCB. In detail, the protective member PM may be disposed on at least one of the driving board FPCB and the main portion MR, the bending portion BR and the sub portion SR of the display panel 100.

The protective member PM may be disposed in a space formed between the display panel 100 and the driving board FPCB connected to the display panel 100. For example, the display panel 100 may be bent to have a 'C' or 'U' shape in cross sectional view, and the protective member PM may be accommodated in the space formed between the display panel 100 and the driving board FPCB. In an embodiment, the protective member PM may be disposed between the main portion MR of the display panel 100 and the sub portion SR of the display panel 100 and/or between the main portion MR of the display panel 100 and the driving board FPCB. In detail, the protective member PM may be disposed between the flat portion MR_F of the main portion MR and the flat portion SR_F of the sub portion SR, between the curved portion MR_C of the main portion MR and the curved portion SR_C of the sub portion SR, and/or between the main portion MR and the driving board FPCB.

The protective member PM may be bent or folded so that a portion of the protective member PM overlaps another portion in the third direction DR3. For example, the protective member PM may be bent or folded so that at least a portion of the protective member PM forms a double layer. In an embodiment, the protective member PM may be bent or folded so that at least a portion disposed between the main portion MR of the display panel 100 and the sub portion SR of the display panel 100 and/or between the main portion MR of the display panel 100 and the driving board FPCB forms a double layer. An end and the other end of the protective member PM may be aligned in the thickness direction (e.g., the third direction DR3). For example, the end and the other end of the protective member PM may overlap each other in the thickness direction.

The protective member PM may attach a portion of the display panel 100 to another portion of the display panel 100 and/or the display panel 100 to the driving board FPCB. The protective member PM may adjust a distance between a portion of the display panel 100 and another portion of the display panel 100 and/or between the display panel 100 and the driving board FPCB. In an embodiment, the protective member PM may attach the main portion MR of the display panel 100 to the sub portion SR of the display panel 100 and adjust a distance between the main portion MR and the sub portion SR.

The protective member PM may include a flat portion PM_F, a curved portion PM_C, and a bending portion PM_B.

The flat portion PM_F of the protective member PM may be disposed in the main display area DA0. The flat portion PM_F of the protective member PM may be disposed between the flat portion MR_F of the main portion MR and the flat portion SR_F of the sub portion SR and/or between the driving board FPCB and the flat portion MR_F of the main portion MR.

The curved portion PM_C of the protective member PM may be disposed in the fourth sub display area DA1_4. The curved portion PM_C of the protective member PM may be disposed between the curved portion MR_C of the main portion MR and the curved portion SR_C of the sub portion SR.

The bending portion PM_B of the protective member PM may be disposed on the bending portion BR of the display panel 100. In detail, the bending portion PM_B of the protective member PM may be accommodated inside the 'C'-shaped bending portion BR of the display panel 100.

Referring to FIG. 4, the protective member PM may include a protective film PF and adhesive members TP1 and TP2.

The protective film PF protects the display panel 100 and/or the driving board FPCB by covering at least a portion of the display panel 100 and/or the driving board FPCB. The protective film PF may include a material having flexibility and durability, such as polyethylene terephthalate (PET), polycarbonate (PC), thermoplastic polyurethane (TPU), or polystyrene latex (PSL).

The adhesive members TP1 and TP2 cover at least a portion of the protective film PF. The adhesive members TP1 and TP2 attach the protective film PF to the display panel 100 and the protective film PF to the driving board FPCB. The adhesive members TP1 and TP2 may be double-sided tapes, but embodiments are not limited thereto.

The adhesive members TP1 and TP2 may include a first adhesive member TP1 disposed on a surface of the protective film PF which faces the display panel 100 and a second adhesive member TP2 disposed on the other surface of the protective film PF which is opposite the above surface of the protective film PF.

The protective member PM may be attached to the display panel 100 and the driving board FPCB by an apparatus 2 for manufacturing a display device. The apparatus 2 and method for manufacturing a display device will be described in detail later with reference to FIGS. 8, 9, 10, 11, 12, 13, 14, 15, 16, 17, and 18.

Figure 5:
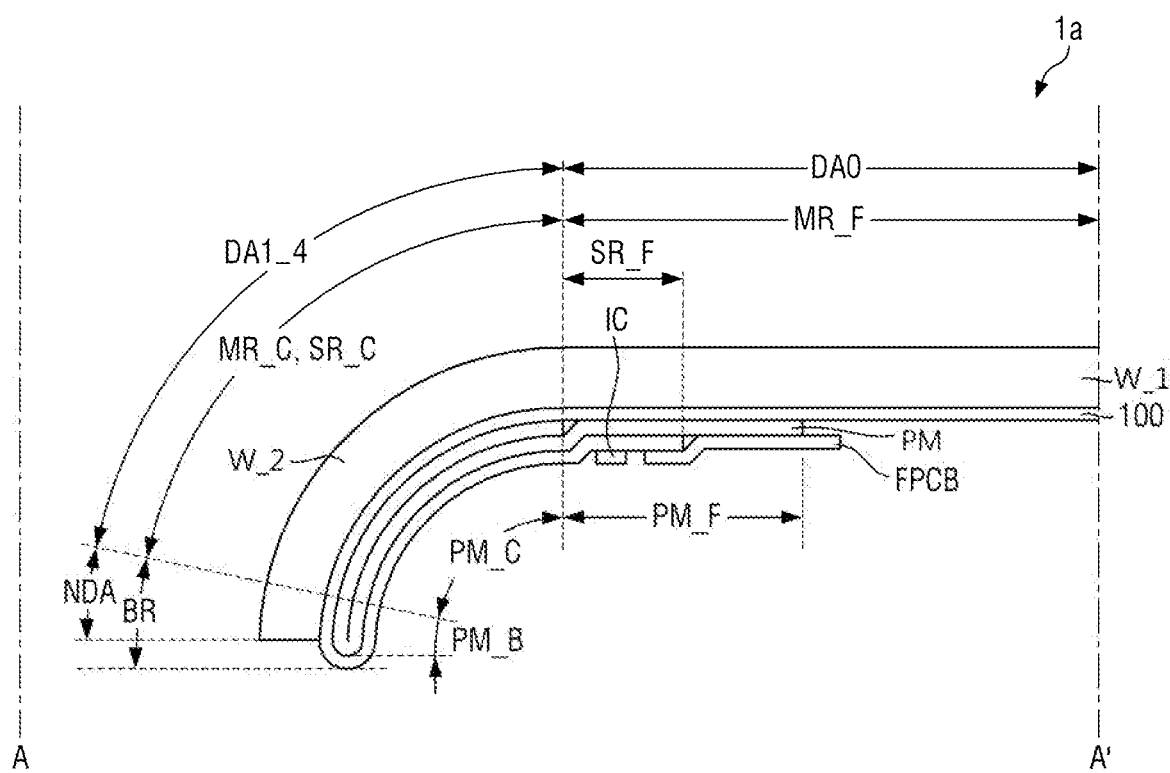
FIG. 5 is a cross-sectional view of a fourth sub display area of another embodiment of a display device constructed according to the principles of the invention.

FIG. 5 is a cross-sectional view of a fourth sub display area DA1_4 of another embodiment of a display device 1*a* constructed according to the principles of the invention.

The display device 1*a* of FIG. 5 is different from the display device 1 of FIGS. 1 through 4 in the placement of a protective member PM.

Referring to FIG. 5, the display device 1*a* may include a display panel 100, a driving board FPCB, and the protective member PM. The display device 1*a* may further include a window substrate W.

Unlike in the embodiment of FIGS. 1, 2, 3, and 4, the protective member PM may be disposed as a single layer on a flat portion MR_F of a main portion MR but may be disposed as a double layer on a curved portion MR_C. In detail, the protective member PM is disposed only on a flat portion SR_F of a sub portion SR of the base substrate SUB, a curved portion SR_C of the sub portion SR, a bending portion BR, and the curved portion MR_C of the main portion MR. Accordingly, when the display panel 100 is bent at the bending portion BR, the protective member PM may, for example, be disposed as a double layer in the fourth sub display area DA1_4 but may be disposed as a single layer in a main display area DA0. For example, the protective member PM may be folded or bent so that only a portion disposed on the curved portion MR_C of the main portion MR forms a double layer.

A portion of the protective member PM which is disposed on the curved portion MR_C of the main portion MR of the display panel 100 may be shorter in length than another portion of the protective member PM which is disposed on the curved portion SR_C of the sub portion SR of the display panel 100, the flat portion SR_F of the sub portion SR, and the driving board FPCB.

A portion of the protective member PM which is disposed at a boundary between the main display area DA0 and the fourth sub display area DA1_4 may be bent due to a step formed by an end of the protective member PM disposed on a surface of the display panel 100.

In some embodiments, an area in which the protective layer PM is disposed as a double layer may not necessarily coincide with the boundary of a sub display area DA1 or the main display area DA0, and the protective member PM can be disposed in various ways.

The display device 1*a* of FIG. 5 is substantially the same as or similar to the display device 1 of FIGS. 1, 2, 3, and 4 except for the placement of the protective member PM, and thus a redundant description thereof will be omitted for descriptive convenience.

Figure 6:
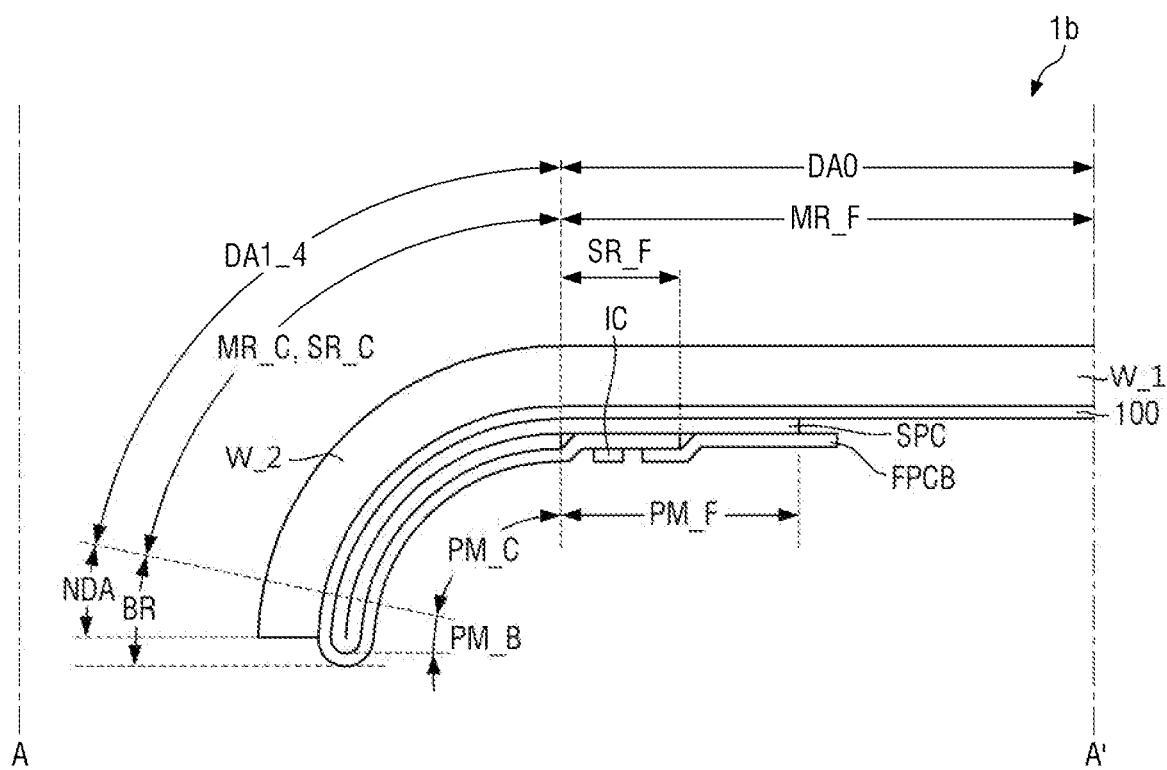
FIG. 6 is a cross-sectional view of a fourth sub display area of another embodiment of a display device constructed according to the principles of the invention.
Figure 6:
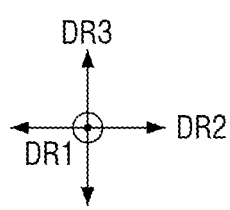

FIG. 6 is a cross-sectional view of a fourth sub display area DA1_4 of another embodiment of a display device 1*b* constructed according to the principles of the invention.

The display device 1*b* of FIG. 6 is different from the display device 1*a* of FIG. 5 in the placement of a protective member PM.

Referring to FIG. 6, the display device 1*b* may include a display panel 100, a driving board FPCB, and the protective member PM. The display device 1*b* may further include a window substrate W.

Unlike in the embodiment of FIG. 5, a portion of the protective member PM which is disposed on a curved portion MR_C and flat portion MR_F of a main portion MR of the display panel 100 may be longer in length than another portion of the protective member PM which is disposed on a curved portion SR_C of a sub portion SR of the display panel 100.

An end and the other end of the protective member PM may not be aligned in the thickness direction. For example, the end and the other end of the protective member PM may not overlap each other in the thickness direction. In detail, an end of the protective member PM may be disposed between the flat portion MR_F of the main portion MR of a display panel 100 and the driving board FPCB, and the other end of the protective member PM may be disposed between the curved portion MR_C of the main portion MR of the display panel 100 and the curved portion SR_C of the sub portion SR. The end of the protective member PM disposed between the flat portion MR_F of the main portion MR of the display panel 100 and the driving board FPCB may be an end located above the other end.

A portion of display panel 100 which is disposed at a boundary between a main display area DA0 and the fourth sub display area DA1_4 may be bent due to a step formed by an end of the protective member PM disposed on a surface of the display panel 100.

The display device 1*b* of FIG. 6 is substantially the same as or similar to the display device 1*a* of FIG. 5 except for the placement of the protective member PM, and thus a redundant description thereof will be omitted for descriptive convenience.

Figure 7:
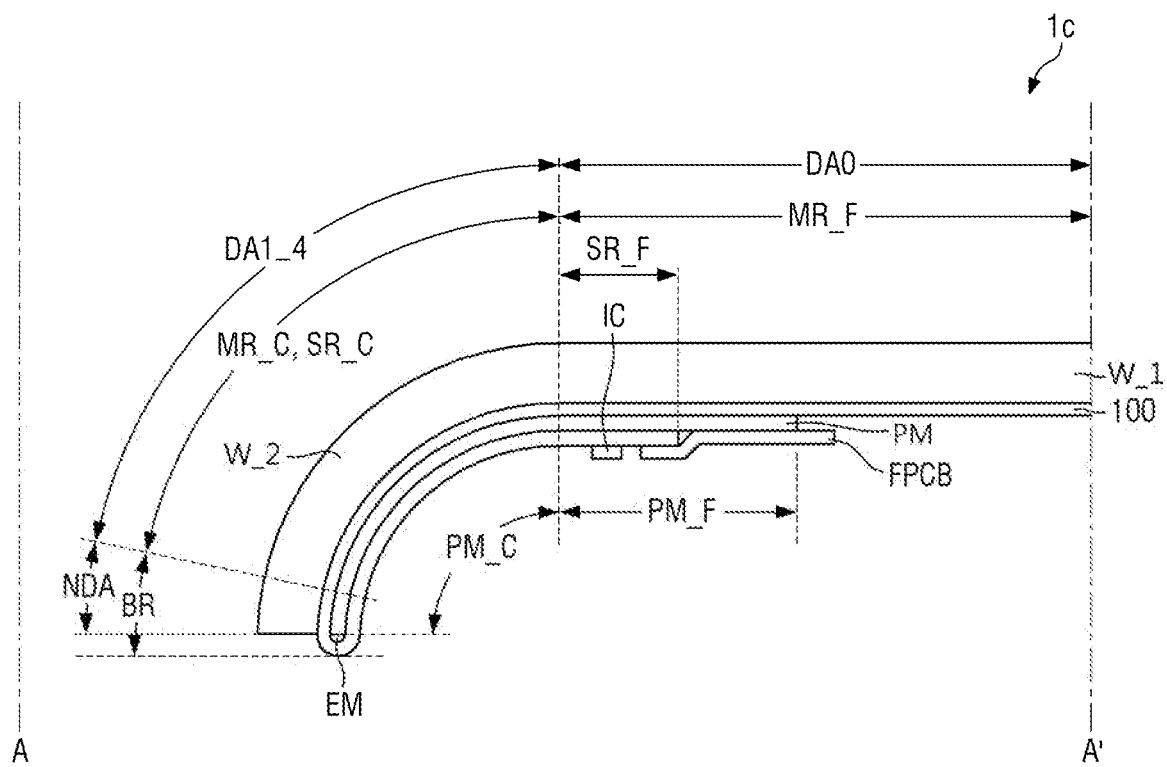
FIG. 7 is a cross-sectional view of a fourth sub display area of another embodiment of a display device constructed according to the principles of the invention.

FIG. 7 is a cross-sectional view of a fourth sub display area DA1_4 of another embodiment of a display device 1*c* constructed according to the principles of the invention.

The display device 1*c* of FIG. 7 is different from the display device 1 of FIGS. 1, 2, 3, and 4 in the placement of a protective member PM.

Referring to FIG. 7, the display device 1*c* may include a base substrate SUB, a driving board FPCB, and the protective member PM. The display device 1*c* may further include a window substrate W.

Unlike in the embodiments of FIGS. 1, 2, 3, 4, 5, and 6, the protective member PM may be disposed as a single layer. Specifically, the protective member PM may be disposed as a single layer between a curved portion MR_C of a main portion MR of a display panel 100 and a curved portion SR_C of a sub portion SR, between a flat portion MR_F of the main portion MR of the display panel 100 and a flat portion SR_F of the sub portion SR, and/or between the flat portion MR_F of the main portion MR of the display panel 100 and the driving board FPCB.

A gap EM may be formed between a bending portion BR of the display panel 100 and the protective member PM. In detail, the gap EM may be formed between a 'C'-shaped inner surface formed by the bending portion BR of the display panel 100 and an end of the protective member PM.

The display device 1*c* of FIG. 7 is substantially the same as or similar to the display device 1 of FIGS. 1, 2, 3, and 4 except for the placement of the protective member PM, and thus a redundant description thereof will be omitted for descriptive convenience.

An apparatus 2 for manufacturing a display device according to an embodiment will now be described.

Figure 8:
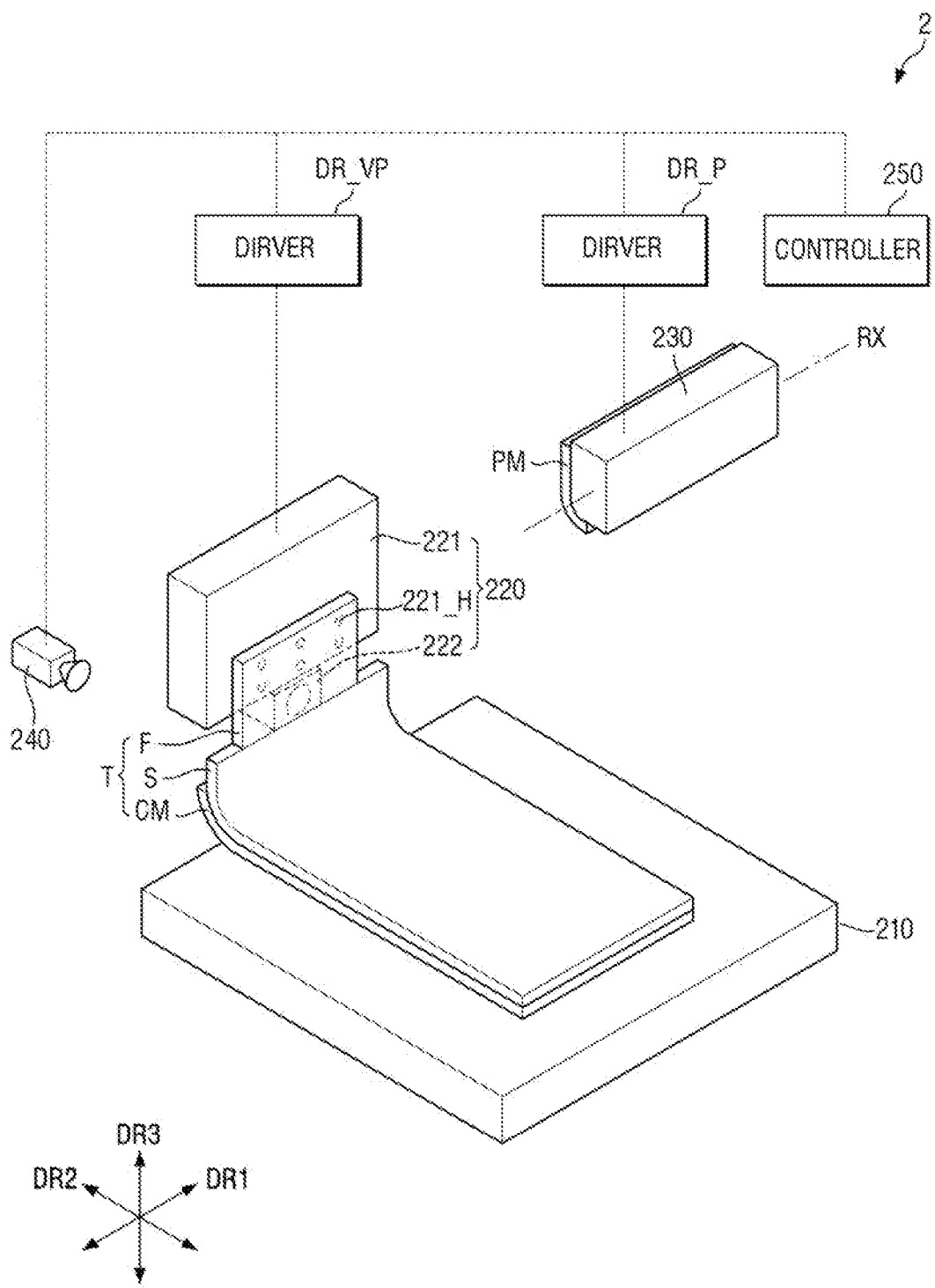
FIG. 8 is a perspective view of an embodiment of an apparatus for manufacturing a display device constructed according to the principles of the invention.
Figure 9:
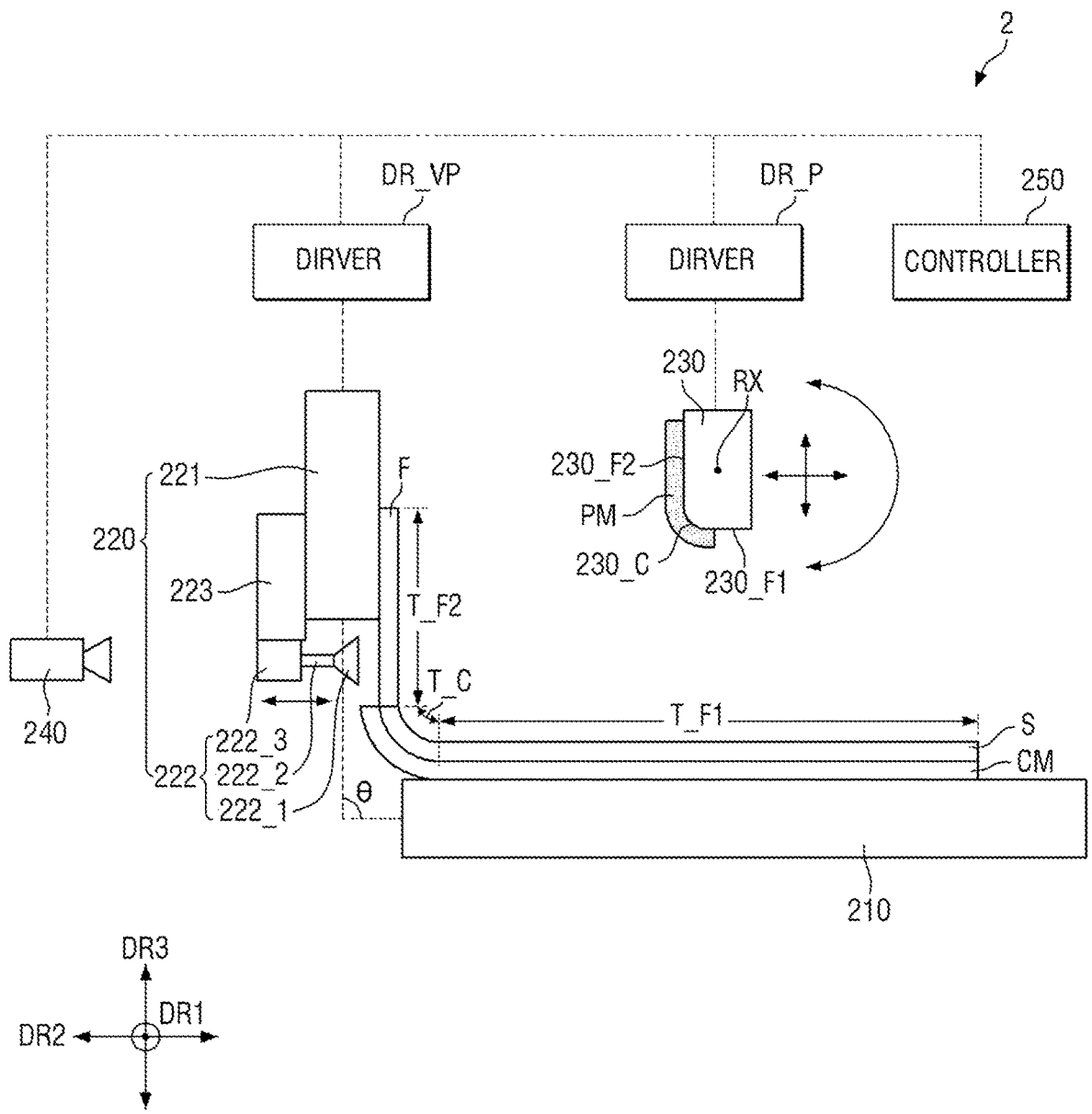
FIG. 9 is a side view of the display device manufacturing apparatus of FIG. 8.

FIG. 8 is a perspective view of an embodiment of an apparatus 2 for manufacturing a display device constructed according to the principles of the invention. FIG. 9 is a side view of the display device manufacturing apparatus 2 of FIG. 8.

The display device manufacturing apparatus 2 may attach a protective member PM to a target object T.

The target object T may include a target substrate S and a flexible film attached to the target substrate S. The target object T may further include a cover member CM.

Examples of the target substrate S may include various types of panels or substrates such as display panels and touch panels, and examples of the flexible film F may include various types of film members or flexible circuit boards.

The target substrate S and the flexible film F may have flexibility. In an embodiment, a side of the target substrate S may be bent upward so that the target substrate S has an 'L'-shaped cross section, and the flexible film F may be attached to the side of the target substrate S at an angle to the other side of the target substrate S. For example, the flexible film F may be attached to the side of the target substrate S at a right angle to the other side of the target substrate S.

The cover member CM covers at least a portion of the target substrate S. For example, in FIG. 8, the cover member CM may cover at least a portion of a lower surface of the target substrate S. The cover member CM may have a shape corresponding to the shape of the target substrate S. In an embodiment, a side of the cover member CM may be bent upward so that the cover member CM has an 'L'-shaped cross section.

The target substrate S, the flexible film F, and the cover member CM may have a rectangular shape in a plan view, but embodiments are not limited thereto.

The protective member PM is attached to both the target substrate S and the flexible film F. The protective member PM may be mounted on a pressing unit 230 which will be described later and then transferred to the target substrate S and the flexible film F by pressing by the pressing unit 230. The protective member PM may include a protective film PF and adhesive members respectively disposed on a surface of the protective film PF which is pressed against the target object T and the other surface which is opposite the above surface. The adhesive members may be double-sided tapes to which release paper is attached.

In an embodiment, the target object T may be the display devices 1, 1*a*, 1*b*, 1*c* of FIGS. 1, 2, 3, 4, 5, 6, and 7. In detail, the target substrate S, the flexible film F, the cover member CM, and the protective member PM may be the display panel 100, the driving board FPCB, the window substrate W, and the protective member PM of FIGS. 1, 2, 3, 4, 5, 6, and 7, respectively. For example, the target object T of FIG. 8 may be the display panel 100, the driving board FPCB, and the window substrate W of FIG. 1 turned upside down. The protective film F and the adhesive members may be the protective film PF and the adhesive members TP1 and TP2 of FIG. 4, respectively. Here, the target object T may be the display panel 100, the driving board FPCB, and the window substrate W in a state where the protective member PM has not yet been attached and the sub portion SR and the bending portion BR of the display panel 100 have not been completely bent.

Referring to FIGS. 8 and 9, the display device manufacturing apparatus 2 may include a stage 210, a support unit 220, the pressing unit 230, and a controller 250. The display device manufacturing apparatus 2 may further include a camera 240.

The stage 210 provides a space in which at least a portion of the target object T can be mounted. The stage 210 may extend in one direction and include a generally flat upper surface. The one direction may be a horizontal direction (e.g., in the first direction DR1 or the second direction DR2). At least a portion of the target object T may be mounted on the upper surface of the stage 210. At least a portion of the target object T may be the cover member CM. In an embodiment, a side of the target object T may be bent upward so that the target object T has an 'L'-shaped cross section. An end of the target object T may be mounted on the stage 210, and the other end of the target object T may be mounted on the support unit 220 which will be described later. In some embodiments, the stage 210 may include a chucking member for fixing the target object T. The chucking member may fix the target object T using vacuum, static electricity, and/or Van der Waals force. In some embodiments, the stage 210 may move and/or rotate in at least one of the first direction DR1, the second direction DR2, and the third direction DR3. Accordingly, the stage 210 may adjust the position and direction of the target object T.

The support unit 220 may be disposed on a side of the stage 210. The support unit 220 may be spaced apart from the stage 210. At least a portion of the target object T may be mounted and supported on the support unit 220. At least a portion of the target object T may be a portion of the flexible film F. For example, the target object T may be mounted on the stage 210 and the support unit 220. In an embodiment, the target object T may be disposed on the upper surface of the stage 210 extending in the one direction and a side surface of the support unit 220 extending in the other direction. The support unit 220 may be inclined to the stage 210. The support unit 220 may be disposed at a predetermined angle to the stage 210. For example, the stage 210 may be disposed in the horizontal direction, and the support unit 220 may be disposed in a vertical direction. In an embodiment, the predetermined angle may be about 45 to 135 degrees. In some embodiments, the predetermined angle may be about 60 to 120 degrees. In some embodiments, the predetermined angle may be about 90 degrees. The support unit 220 may move in at least one of the first direction DR1, the second direction DR2, and the third direction DR3. In some embodiments, the display device manufacturing apparatus 2 may further include a support unit driver DR_VP which drives the support unit 220, and the support unit driver DR_VP may adjust a distance between the support unit 220 and the stage 210 and/or the position of the support unit 220 relative to the stage 210 by moving the support unit 220 in the second direction DR2.

The support unit 220 may include a first suction unit 221 and a second suction unit 222. The support unit 220 may further include a fixing member 223.

The first suction unit 221 may be disposed on a side of the stage 210 and may be shaped like a vertically long block. A portion of the flexible film F may be mounted on a surface of the first suction unit 221 which faces the direction in which the stage 210 is located. The first suction unit 221 may include a chucking member for fixing the flexible film F. The first suction unit 221 may include, for example, a suction member such as a vacuum pad.

The second suction unit 222 may be disposed under the first suction unit 221. In detail, the second suction unit 222 may be disposed in a space between the bottom of the first suction unit 221 and the upper surface of the stage 210. The second suction unit 222 may move and/or stretch or shorten in the second direction DR2. Accordingly, a distance between the second suction unit 222 and the target object T may be adjusted so that the second suction unit 222 can be moved into close contact with or spaced apart from the target object T. When the pressing unit 230 to be described later presses a surface of the target object T, the second suction unit 222 sucks and supports the other surface of the target object T to prevent the target object T from being deformed or damaged by the pressing of the target object T.

The second suction unit 222 may include a motor 222_3, a link portion 222_2, and a pad portion 222_1.

The motor 222_3 provides power for moving and/or stretching or shortening the link portion 222_2.

The link portion 222_2 moves and/or stretches or shortens in the second direction DR2. The link portion 222_2 may include a hydraulic/pneumatic cylinder or articulated link mechanism whose length can be adjusted.

The pad portion 222_1 is disposed at an end of the link portion 222_2. As a length or position of the link portion 222_2 is adjusted, a distance between the pad portion 222_1 and the flexible film F may be adjusted. Accordingly, the pad portion 222_1 may be moved into close contact with or spaced apart from the flexible film F. The pad portion 222_1 may include, for example, a suction member such as a vacuum pad.

The fixing member 223 may be disposed on the other surface of the first suction unit 221. The fixing member 223 may fix the second suction unit 222 to the first suction unit 221.

The pressing unit 230 is spaced apart from the stage 210 and the support unit 220. The pressing unit 230 may move and/or rotate in at least one of the first direction DR1, the second direction DR2, and the third direction DR3. In an embodiment, the display device manufacturing apparatus 2 may further include a pressing unit driver DR_P which moves the pressing unit 230, and the pressing unit driver DR_P may move the pressing unit 230 in the first direction DR1 and the third direction DR3 and rotate the pressing unit 230 in a clockwise direction or a counterclockwise direction about the first axis of the first direction DR1. Accordingly, a distance between the pressing unit 230 and the stage 210, between the pressing unit 230 and the support unit 220, and/or between the pressing unit 230 and the target object T may be adjusted. In some embodiments, the pressing unit driver DR_P may include a mechanical arm that moves and/or rotates the pressing unit 230. In some embodiments, the pressing unit driver DR_P may further include at least one of a motor, a cylinder, and a reducer. The pressing unit 230 may have the protective member PM mounted thereon. The pressing unit 230 may include a chucking member for fixing the protective member PM. The pressing unit 230 may include, for example, a vacuum hole or a vacuum pad. At least one surface of the pressing unit 230 may have a shape corresponding to the shape of a portion of the target object T which is to be pressed.

The pressing unit 230 may include a first flat surface 230_F1, a second flat surface 230_F2, and a curved surface 230_C.

The first flat surface 230_F1, the second flat surface 230_F2, and the curved surface 230_C may be disposed to face the target object T. The first flat surface 230_F1, the second flat surface 230_F2, and the curved surface 230_C may have a shape corresponding to the shape of the surface of the target object T. In an embodiment, the first flat surface 230_F1 may extend in the second direction DR2, the second flat surface 230_F2 may extend in the third direction DR3, and the curved surface 230_C may connect a side of the first flat surface 230_F1 and a side of the second flat surface 230_F2. The curved surface 230_C may have a convex outward curvature. The first flat surface 230_F1, the second flat surface 230_F2, and the curved surface 230_C may include at least one vacuum hole.

The protective member PM may be mounted on at least one of the first flat surface 230_F1, the curved surface 230_C, and the second flat surface 230_F2. In an embodiment, the protective member PM may be mounted on the first flat surface 230_F1 and the curved surface 230_C. In some embodiments, the protective member PM may be mounted on the curved surface 230_C and the second flat surface 230_F2.

The pressing unit 230 may be configured to be movable or rotatable according to the shape of a portion of the target object T which is bent and may have a shape corresponding to the shape of a portion of the target object T which is to be pressed. The corresponding shape of the pressing unit 230 can minimize stress applied to the target object T, thereby reducing deformation of or damage to the target object T caused by pressing.

The controller 250 controls the overall driving of the display device manufacturing apparatus 2. In an embodiment, the controller 250 may control at least one of the stage 210, the support unit 220, the pressing unit 230, and the camera 240. Specifically, the controller 250 may control the support unit driver DR_VP to align the target object T in a correct position or a target position. In addition, the controller 250 may control the pressing unit driver DR_P to press the protective member PM in a correct position on the target object T with minimum pressure based on pre-stored hardness information, dimension information and curvature information of a portion of the target object T which is pressed. Furthermore, the controller 250 may obtain alignment information of the target object T from the camera 240 to be described later and determine whether the target object T has been aligned and/or whether the protective member PM has been attached in the correct position. For example, the controller 250 may calculate a difference in height between a side and the other side of the target object T based on photographing information obtained from the camera 240 and determine whether the protective member PM has been attached in the correct position by comparing the obtained photographing information with a pre-stored reference range.

The camera 240 is disposed on a side of the stage 210. In an embodiment, the camera 240 may be disposed behind the support unit 220. In some embodiments, the camera 240 may be disposed between the support unit 220 and the stage 210. The camera 240 obtains alignment information related to the alignment of the target object T by photographing the target object T. The alignment information may include a difference in height between a side of the target object T and the other side of the target object T. For example, the height difference may be a difference in height between a side of the target substrate S and the other side of the target substrate S or between a side of the flexible film F and the other side of the flexible film F. In some embodiments, the display device manufacturing apparatus 2 may further include a vision system using the camera 240.

Figure 10:
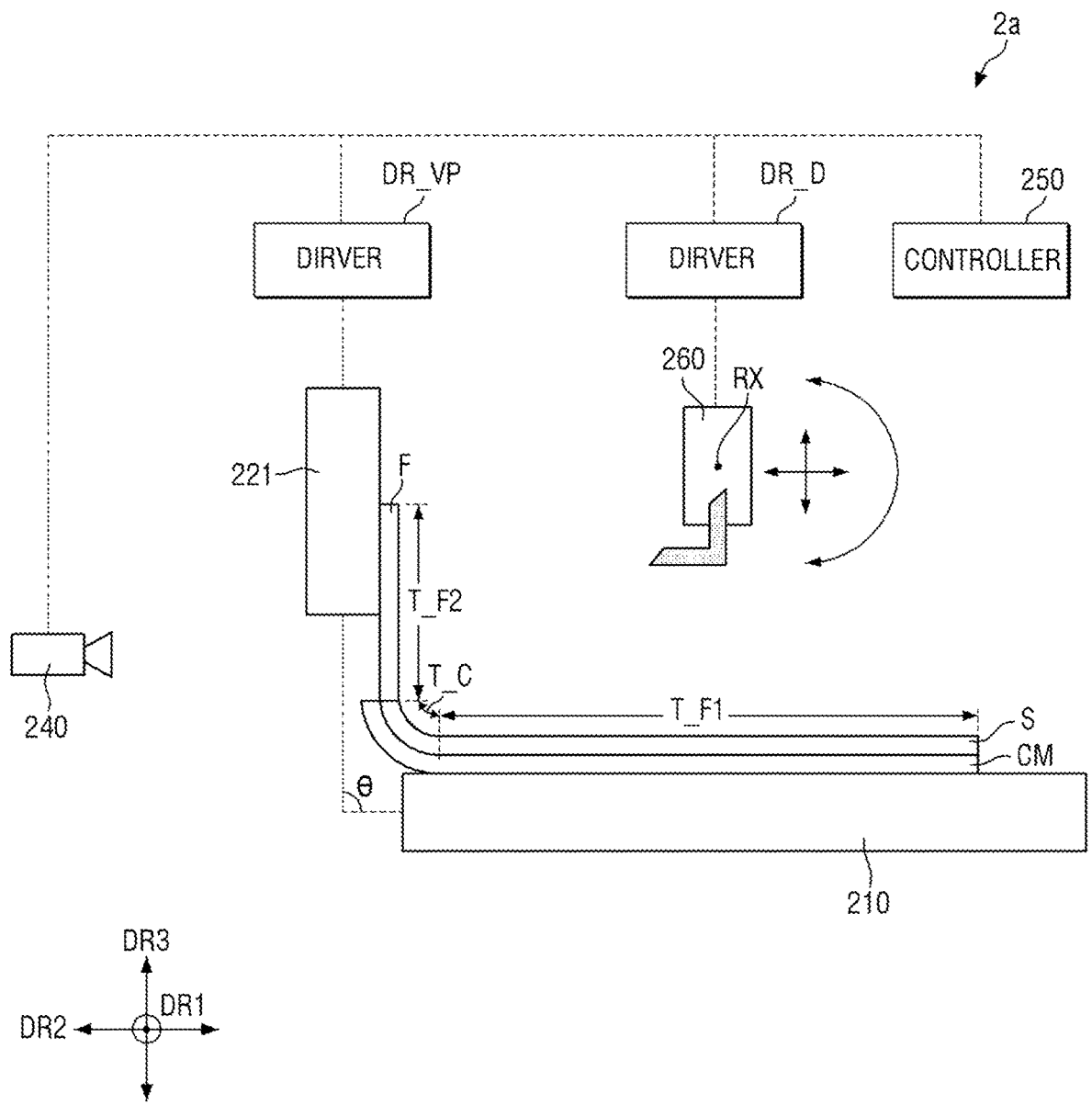
FIG. 10 is a side view of another embodiment of the apparatus for manufacturing the display device of FIG. 8.

FIG. 10 is a side view of an embodiment of an apparatus 2a for manufacturing a display device constructed according to the principles of the invention.

The display device manufacturing apparatus 2a of FIG. 10 is different from the display device manufacturing apparatus 2 of FIG. 8 in that it includes a coating unit 260 instead of the pressing unit 230.

Referring to FIG. 10, the display device manufacturing apparatus 2a may include a stage 210, a support unit 220, the coating unit 260, and a controller 250. The display device manufacturing apparatus 2a may further include a camera 240.

The coating unit 260 is spaced apart from the stage 210 and the support unit 220. The coating unit 260 may move and/or rotate in at least one of the first direction DR1, the second direction DR2, and the third direction DR3. In an embodiment, the display device manufacturing apparatus 2a may further include a coating unit driver DR_D which moves the coating unit 260, and the coating unit driver DR_D may move the coating unit 260 in the first direction DR1 and the third direction DR3 and rotate the coating unit 260 in the clockwise direction or the counterclockwise direction about the first axis of the first direction DR1. Accordingly, a distance between the coating unit 260 and the stage 210, between the coating unit 260 and the support unit 220, and/or between the coating unit 260 and a target object T may be adjusted. In some embodiments, the coating unit driver DR_D may include a mechanical arm that moves and/or rotates the coating unit 260. In some embodiments, the coating unit driver DR_D may further include at least one of a motor, a cylinder, and a reducer.

The coating unit 260 may spray a coating agent to the target object T. The sprayed coating agent may be cured to form a protective layer on a portion of the target object T. The coating agent may include an adhesive. In an embodiment, the coating unit 260 may include, for example, a non-contact dispenser such as a jetting valve.

The display device manufacturing apparatus 2a of FIG. 10 is substantially the same as or similar to the display device manufacturing apparatus 2 of FIG. 8 except that it includes the coating unit 260 instead of the pressing unit 230, and thus a redundant description thereof will be omitted for descriptive convenience.

Methods of manufacturing a display device will now be described with reference to FIGS. 11, 12, 13, 14, and 15.

FIGS. 11, 12, 13, and 14 illustrate an embodiment of a method of manufacturing a display device according to the principles of the invention.

Figure 11:
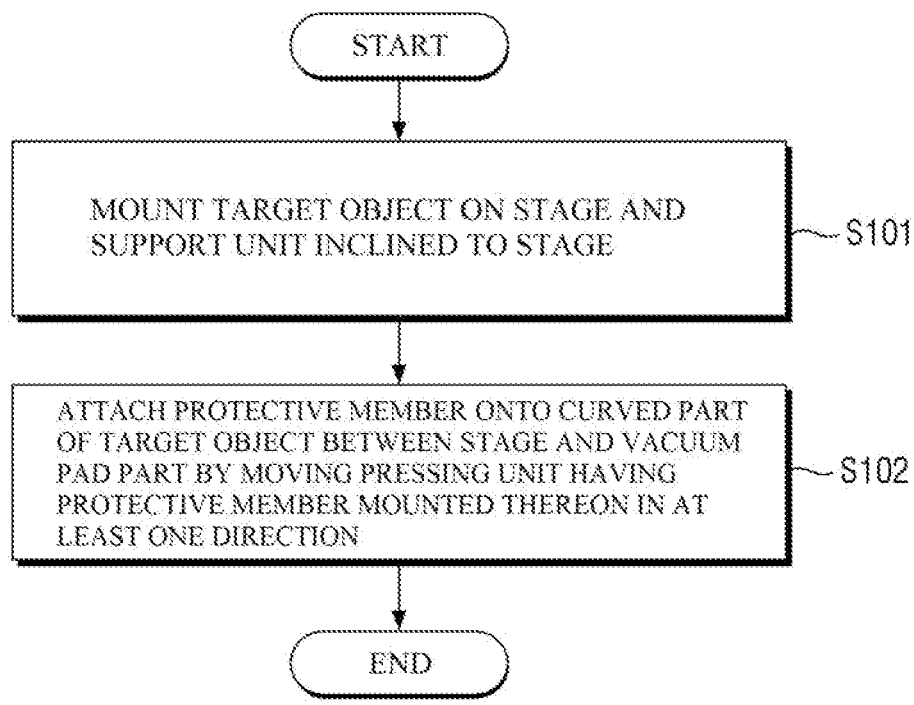
FIGS. 11, 12, 13, and 14 illustrate an embodiment of a method of manufacturing a display device according to the principles of the invention.
Figure 12:
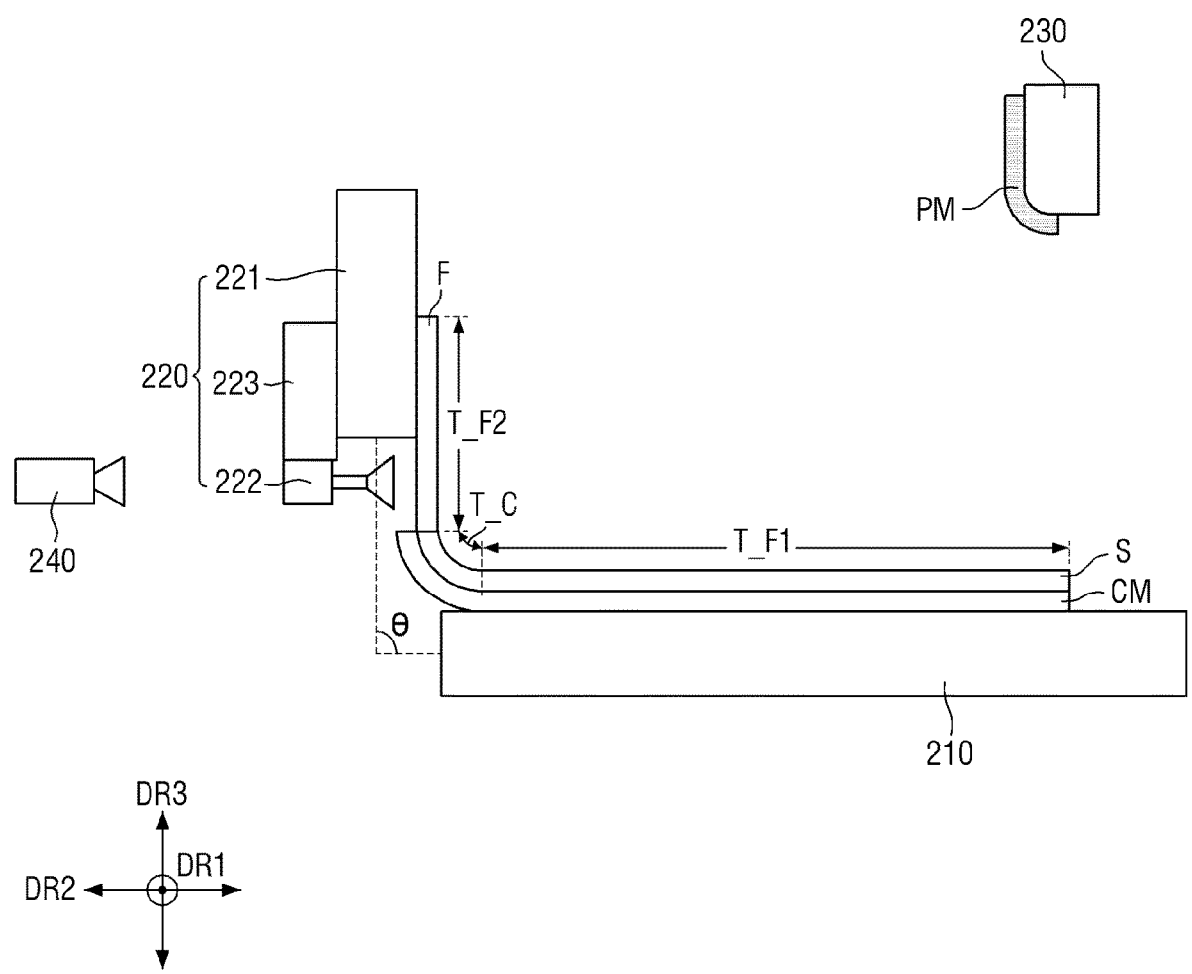
Figure 13:
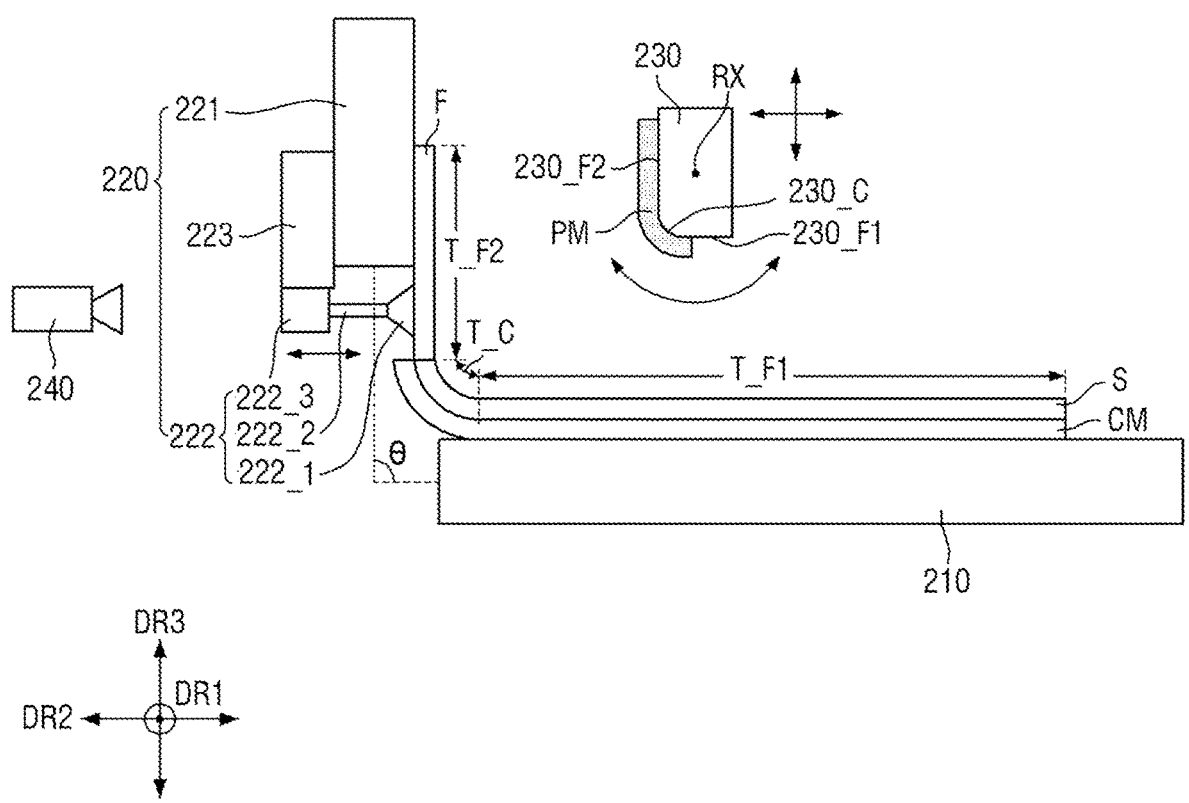
Figure 14:
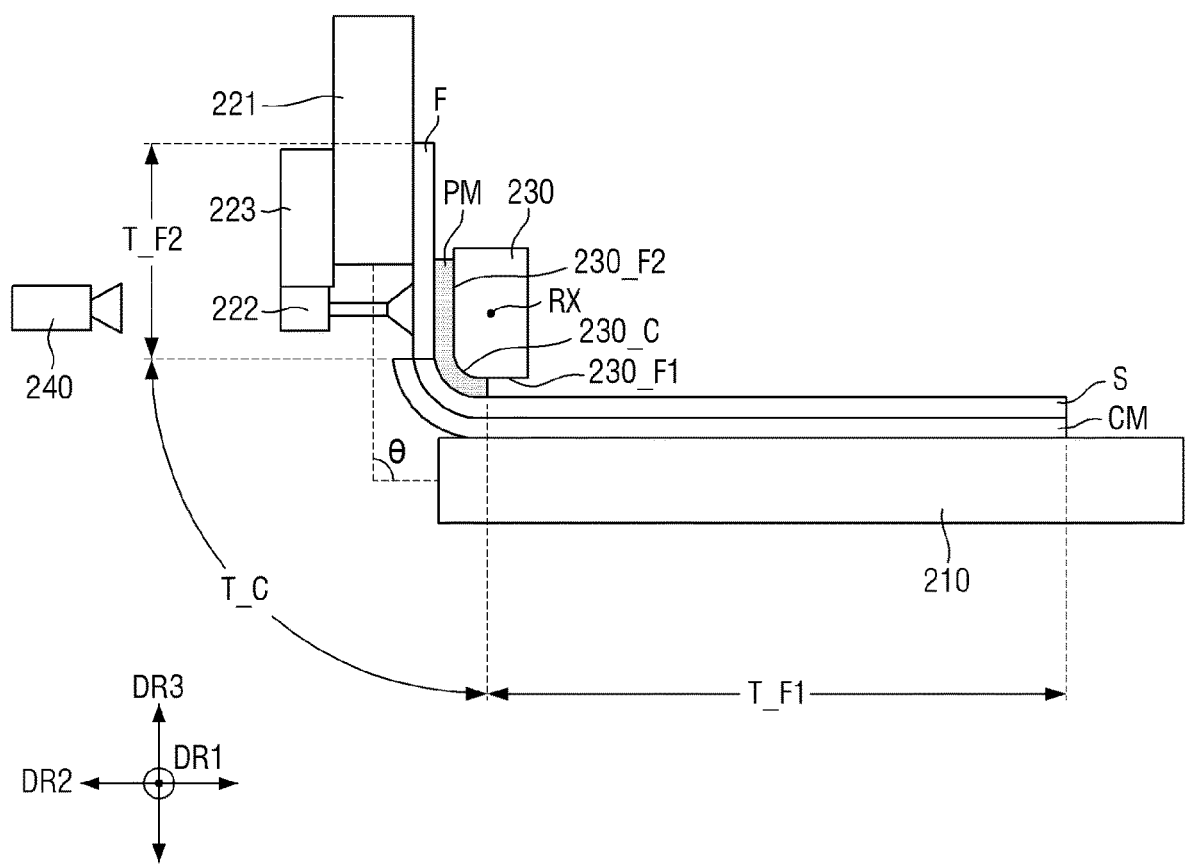

FIG. 11 is a flowchart illustrating a method of manufacturing a display device according to an embodiment. FIG. 12 illustrates a process of mounting a target object T on a stage 210 and a support unit 220. FIG. 13 illustrates a process in which a pressing unit 230 moves toward the target object T. FIG. 14 illustrates a process in which the pressing unit 230 presses a protective member PM against the target object T.

The display device manufacturing method may be performed by the display device manufacturing apparatus 2 of FIG. 8.

Referring to FIGS. 11 and 14, the display device manufacturing method may include mounting the target object T on the stage 210 and the support unit 220 inclined to the stage 210 and attaching a protective member PM onto a curved portion of the target object T between the stage 210 and a vacuum pad portion 222_1 by moving the pressing unit 230 having the protective member PM mounted thereon in at least one direction.

The mounting of the target object T on the stage 210 and the support unit 220 inclined to the stage 210 may further include mounting a portion of a display panel 100 on an upper surface of the stage 210 and mounting a portion of a flexible film F on a side surface of the support unit 220, aligning the target object T by moving the stage 210, and adjusting an angle between the stage 210 and the support unit 220.

The attaching of the protective member PM onto the curved portion of the target object T between the stage 210 and the vacuum pad portion 222_1 by moving the pressing unit 230 having the protective member PM mounted thereon in at least one direction may include rotating the pressing unit 230 according to the shape of a portion of the target object T which is to be pressed and bringing the pressing unit 230 into close contact with the target object T.

The display device manufacturing method may further include measuring a height difference of the target object T after the attaching of the protective member PM and determining whether the height difference satisfies an error criterion.

The display device manufacturing method is not limited to the above example, and at least some of the operations may be omitted, or at least one additional operation may be further included with reference to FIGS. 12, 13, 14, 15, 16, 17, and 18. A display device manufactured by the display device manufacturing method includes the display devices 1, 1a, 1b, 1c of FIGS. 1, 2, 3, 4, 5, 6, and 7.

The display device manufacturing method will now be described in detail with reference to FIGS. 12, 13, and 14.

Referring to FIG. 12, the target object T is mounted on the stage 210 and the support unit 220 disposed at a predetermined angle to the stage 210. In an embodiment, the predetermined angle may be about 45 to 135 degrees. In some embodiments, the predetermined angle may be about 60 to 120 degrees. In some embodiments, the predetermined angle may be about 90 degrees. In an embodiment, the support unit 220 may be configured to be movable and/or rotatable in at least one direction to adjust the predetermined angle.

A side of the target object T is bent so that the target object T has an 'L'-shaped cross section. In an embodiment, a first flat portion T_F1 of the target object T which extends in the first direction DR1 may be mounted on the upper surface of the stage 210, and a second flat portion T_F2 of the target object T which extends in the third direction DR3 may be mounted on a side of the support unit 220 which extends in the third direction DR3. A curved portion T_C between the first flat portion T_F1 and the second flat portion T_F2 of the target object T may be disposed in a space between the stage 210 and the support unit 220. Here, the curved portion T_C of a target substrate S of the target object T may be supported by the curved portion T_C of a cover member CM.

A camera 240 may obtain alignment information of the target substrate S and the flexible film F of the target object T mounted on the stage 210 and the support unit 220, and the stage 210 and/or the support unit 220 may move and/or rotate to align the target substrate S and the flexible film F in a correct position or a target position based on the alignment information.

The protective member PM is mounted on the pressing unit 230. The protective member PM may be mounted by a vacuum hole or a vacuum pad of the pressing unit 230. The protective member PM may include a protective film F, and double-sided tapes may be attached to a surface of the protective film F which faces the target object T and the other surface of the protective film F which faces the pressing unit 230. The double-sided tapes may have release paper attached thereto. Here, the release paper may be removed from the double-sided tape disposed on the surface of the protective film F which faces the target object T.

Referring to FIG. 13, after the target object T is mounted, the pressing unit 230 moves and/or rotates in at least one direction. In an embodiment, the pressing unit 230 may move in the second direction DR2 and the third direction DR3 and rotate in the clockwise direction or the counter-clockwise direction about the first axis of the first direction DR1. The pressing unit 230 may move toward a portion of the target object T which is to be pressed. The portion of the target object T which is to be pressed may include a portion to which the protective member PM is to be attached. The pressing unit 230 may rotate according to the shape of an area of the target object T which is to be pressed, for example, according to the curvature of the curved portion T_C and an angle between the first flat portion T_F1 and the second flat portion T_F2, thereby adjusting angles of a first flat surface 230_F1, a second flat surface 230_F2 and a curved surface 230_C of the pressing unit 230. Accordingly, the stress applied to the target object T by pressing can be minimized and/or optimized.

The pressing unit 230 may have the protective member PM mounted on at least a portion of an outer surface facing the target object T. Accordingly, the protective member PM may be selectively attached to some areas of the target object T. In an embodiment, the areas of the target object T may be the first flat portion T_F1 and the curved portion T_C of the target object T, and the protective member PM may be disposed on the first flat surface 230_F1 and the curved surface 230_C.

Before the pressing unit 230 is moved into close contact with the target object T, a second suction unit 222 may stretch in the second direction DR2 to support a surface of the flexible film F. The surface of the flexible film F may be a surface opposite a surface to be pressed by the pressing unit 230. In an embodiment, a link portion 222_2 of the second suction unit 222 may be stretched toward the flexible film F by a motor 222_3, and the pad portion 222_1 disposed at an end of the link portion 222_2 may suck the surface of the flexible film F.

Referring to FIG. 14, the pressing unit 230 may press the protective member PM against the target object T. The protective member PM may be moved into close contact with the target object T and then transferred from the pressing unit 230 to the target object T. After sufficient pressing for attaching the protective member PM is performed, the pressing unit 230 may release the protective member PM so that it can be separated from a portion of the target object T to which the protective member PM has been attached.

After the attaching of the protective member PM, the camera 240 may photograph the target object T to measure a difference in height between a side of the target object T and the other side of the target object T. The sides of the target object T include edges or corners of a portion of each of the target substrate S, the flexible film F and/or the protective member PM.

When the height difference is within a reference range, the attaching process of the protective member PM may be completed. When the height difference is outside the reference range, the pressing unit 230 may press the protective member PM against the target object T again. Here, the pressing unit 230 may move and/or rotate in at least one direction to adjust the positions and/or arrangement of the target object T and the protective member PM.

Figure 15:
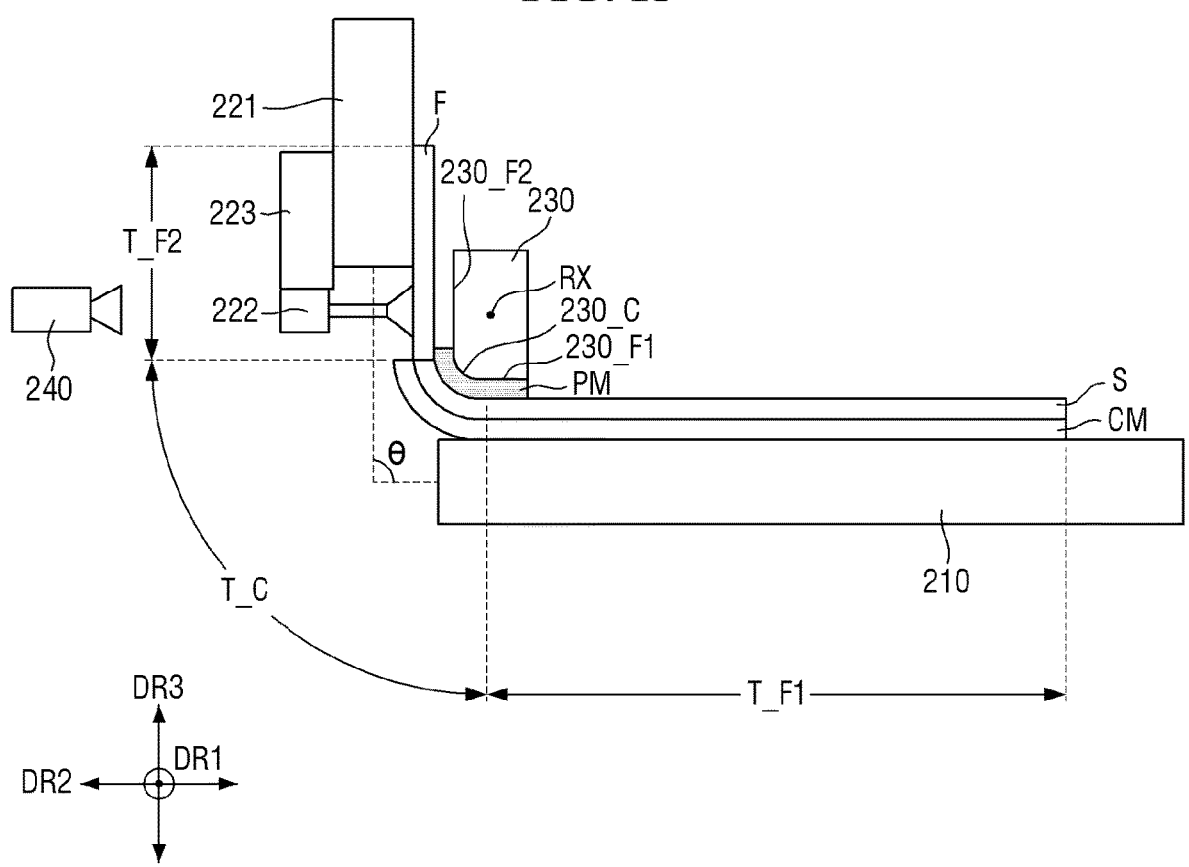
FIG. 15 illustrates another embodiment of a method of manufacturing a display device according to the principles of the invention.

FIG. 15 illustrates another embodiment of a method of manufacturing a display device according to the principles of the invention.

The display device manufacturing method of FIG. 15 is different from the display device manufacturing method of FIG. 14 in a portion where a protective member PM is mounted on a pressing unit 230.

Referring to FIG. 15, the protective member PM may be mounted only on a curved surface 230_C and a first flat surface 230_F1 of the pressing unit 230. Accordingly, the protective member PM may be attached only to a curved portion T_C and a first flat portion T_F1 of a target object T. In some embodiments, the protective member PM may be attached only to the curved portion T_C of the target object T.

For example, the protective member PM may be attached to at least one of the first flat portion T_F1, the curved portion T_C, and a second flat portion T_F2 of the target object T in various ways.

The display device manufacturing method of FIG. 15 is substantially the same as or similar to the display device manufacturing method of FIG. 14 except for the portion where the protective member PM is mounted on the pressing unit 230, and thus a redundant description thereof will be omitted for descriptive convenience.

Figure 16:
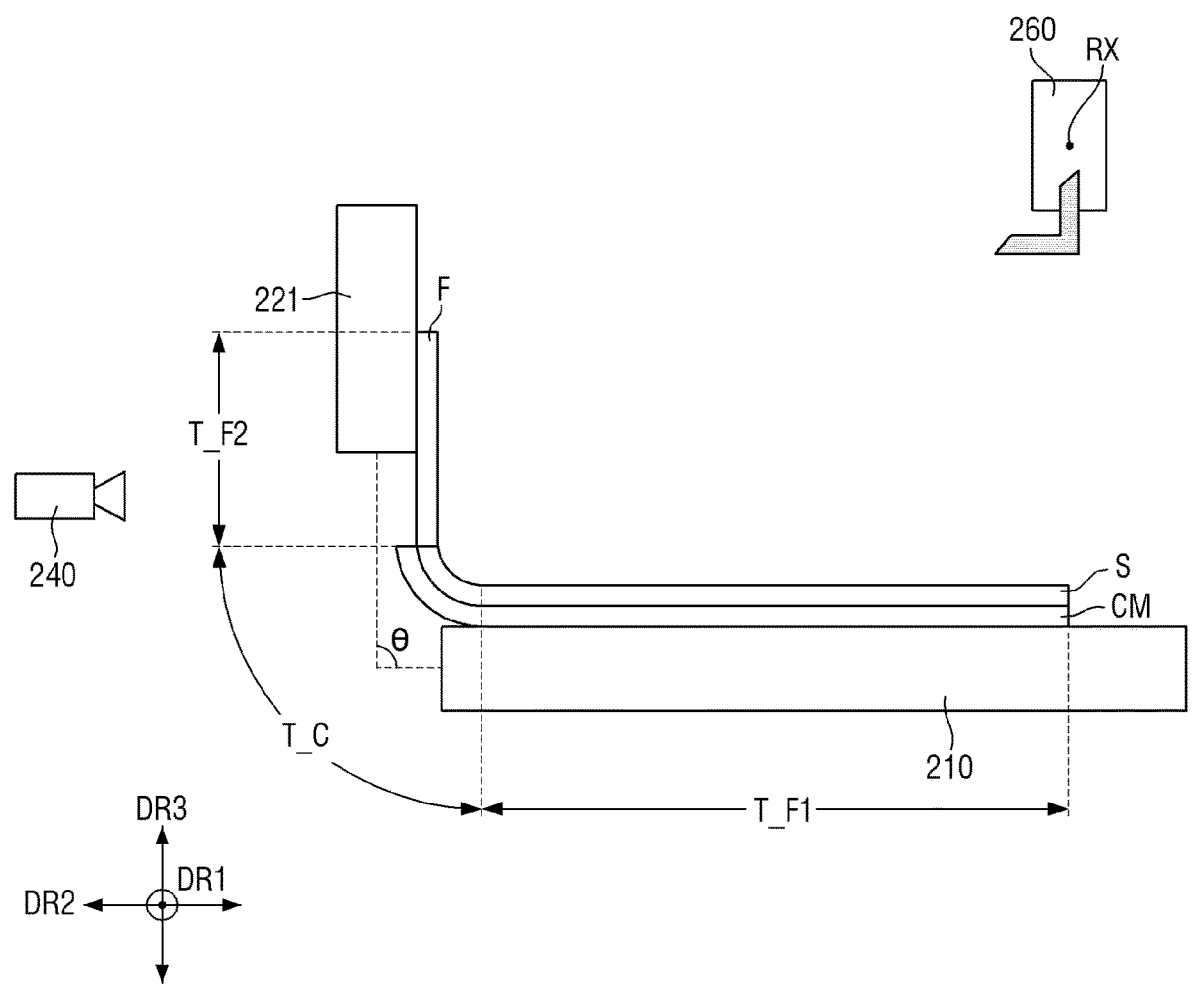
FIGS. 16, 17, and 18 illustrate another embodiment of a method of manufacturing a display device according to the principles of the invention.
Figure 17:
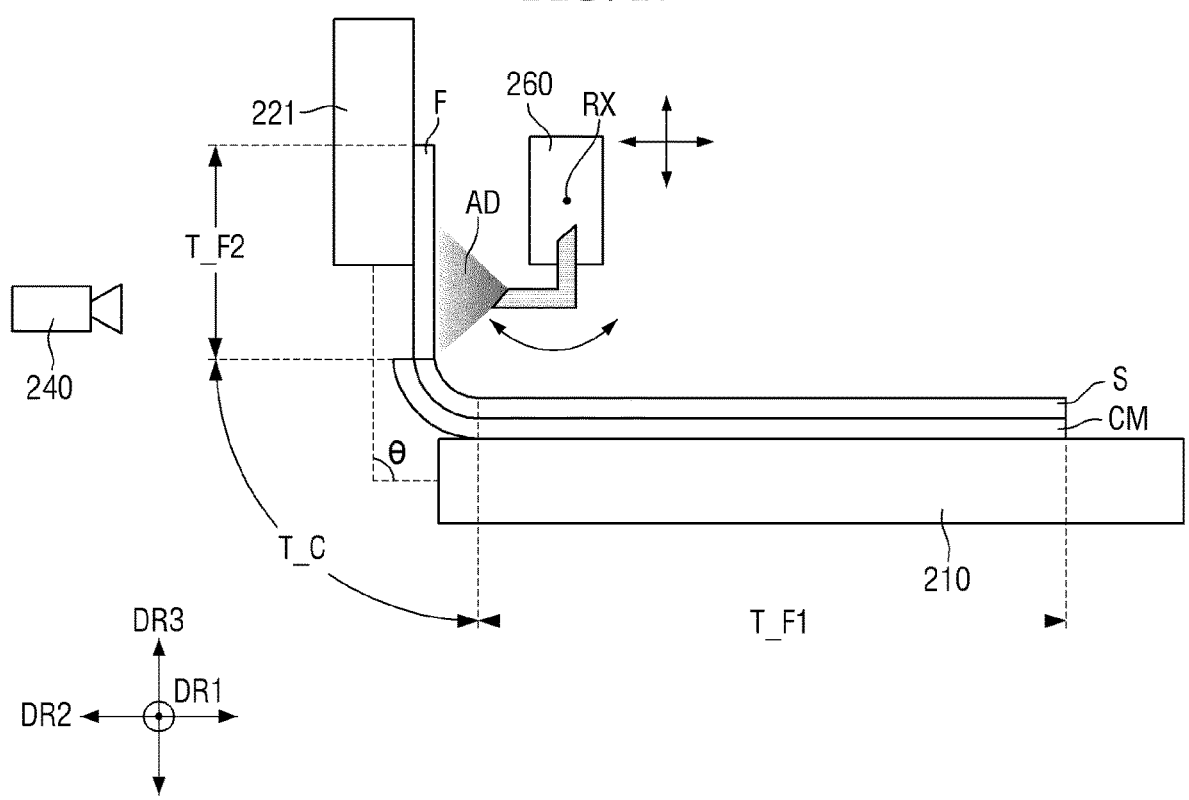
Figure 18:
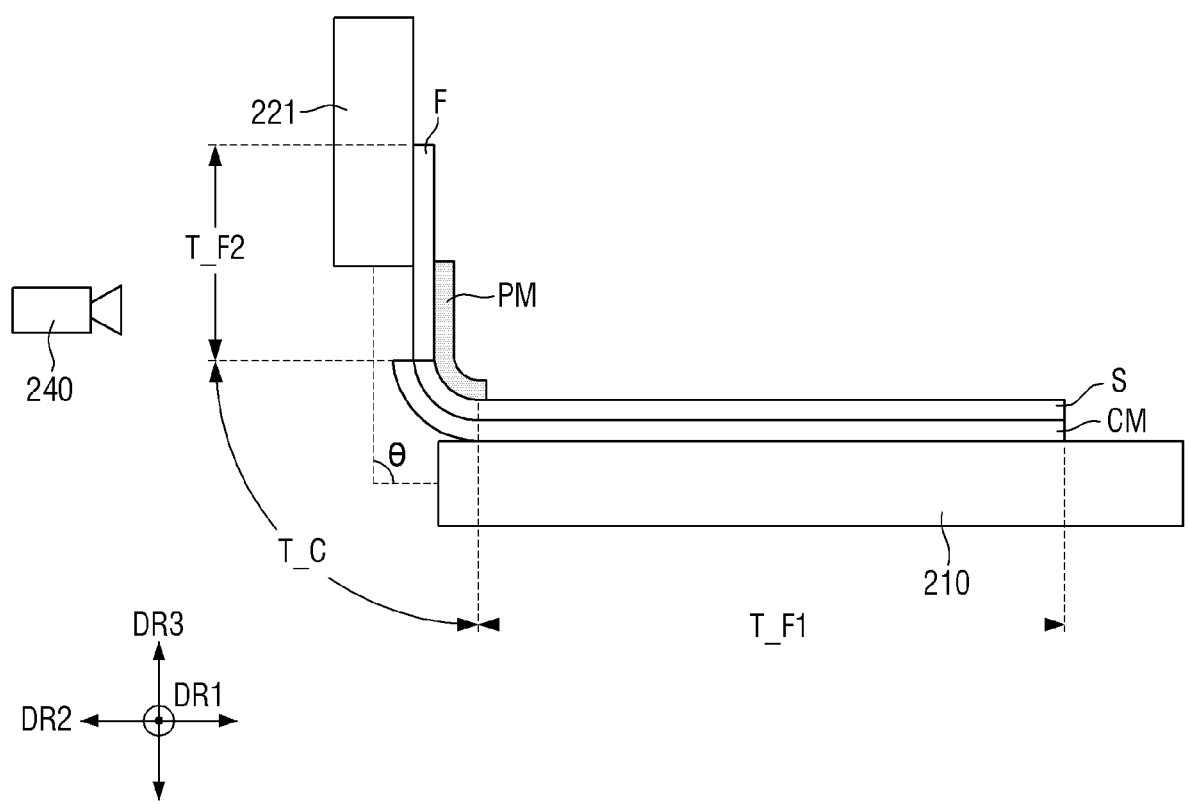

FIGS. 16, 17, and 18 illustrate another embodiment of a method of manufacturing a display device according to the principles of the invention.

FIG. 16 illustrates a process of mounting a target object T on a stage 210 and a support unit 220. FIG. 17 illustrates a process in which a coating unit 260 coats the target object T with a coating agent. FIG. 18 illustrates the target object T on which a protective layer has been formed.

The display device manufacturing method of FIGS. 16, 17, and 18 is different from the display device manufacturing method of FIGS. 11, 12, 13, and 14 in that it uses the coating unit 260 instead of the pressing unit 230.

The display device manufacturing method of FIGS. 16, 17, and 18 may be performed by the display device manufacturing apparatus 2a of FIG. 10.

Referring to FIGS. 16, 17, and 18, the display device manufacturing method may include mounting the target object T on the stage 210 and the support unit 220 inclined to the stage 210 and coating a coating agent on a curved portion T_C of the target object T between the stage 210 and a vacuum pad portion 222_1 by moving the coating unit 260 in at least one direction.

Referring to FIG. 16, the target object T may be mounted on the stage 210 and the support unit 220 disposed at a predetermined angle to the stage 210.

Referring to FIG. 17, after the target object T is mounted, the coating unit 260 moves and/or rotates in at least one direction. The coating unit 260 may move toward a portion of the target object T which is to be coated with the coating agent.

When the coating unit 260 is located at an appropriate distance for coating from the target object T, the coating unit 260 sprays the coating agent to the target object T. Here, the coating unit 260 may spray the coating agent while moving and/or rotating in at least one direction. The coating unit 260 may selectively spray the coating agent to some areas of the target object T. In an embodiment, the coating unit 260 may spray the coating agent to a portion of a second flat portion T_F2 of the target object T and the curved portion T_C of the target object T.

Referring to FIG. 18, after a sufficient amount of coating agent is coated, the coating unit 260 may leave the position where the coating has been performed. The coating agent may be cured to form a protective member PM on the target object T. The protective member PM may be the protective layer.

The display device manufacturing method of FIGS. 16, 17, and 18 is substantially the same as or similar to the display device manufacturing method of FIGS. 11, 12, and 14 except that it uses the coating unit 260 instead of the pressing unit 230, and thus a redundant description thereof will be omitted for descriptive convenience.

A display device and an apparatus and method for manufacturing the display device according to various embodiments can prevent damage to a flexible circuit board attached to a display panel.

A display device and an apparatus and method for manufacturing the display device according to various embodiments can maintain a constant distance between a bent portion of a display panel and another portion of the display panel.

A display device and an apparatus and method for manufacturing the display device according to various embodiments can reduce stress applied to a flexible circuit board attached to a display panel.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising a main portion, a bending portion extending from a side of the main portion, and a sub portion extending from a side of the bending portion;
   a driving board connected to a side of the sub portion and overlapping the main portion of the display panel in a thickness direction; and
   a protective member disposed between the display panel and the driving board,
   wherein the sub portion is folded with respect to the bending portion and attached to a back surface of the main portion,
   wherein the protective member includes a first portion overlapping the main portion, a second portion overlapping the sub portion and a third portion overlapping the bending portion,
   the first portion and the second portion are connected by the third portion, and
   the first portion overlaps the second portion in the thickness direction.

2. The display device of claim 1, wherein the main portion comprises a flat main portion and a curved main portion extending from a side of the flat main portion, and the protective member is disposed on the flat main portion and the curved main portion.

3. The display device of claim 2, wherein the sub portion comprises a flat sub portion and a curved sub portion extending from a side of the flat sub portion, and the protective member is disposed between the flat main portion and the flat sub portion and between the curved main portion and the curved sub portion.

4. A display device comprising:
   a display panel comprising a main portion, a bending portion extending from a side of the main portion, and a sub portion extending from a side of the bending portion;
   a driving board connected to a side of the sub portion and overlapping the main portion of the display panel in a thickness direction; and
   a protective member disposed between the display panel and the driving board,
   wherein the sub portion is folded with respect to the bending portion and attached to a back surface of the main portion,
   wherein the main portion comprises a flat main portion and a curved main portion extending from a side of the flat main portion, and the protective member is disposed on the flat main portion and the curved main portion, and
   wherein the protective member is bent so that a portion of the protective member overlaps another portion of the protective member in the thickness direction.

5. The display device of claim 4, wherein the protective member forms a double layer on the curved main portion.

6. The display device of claim 1, wherein the protective member comprises a protective film, a first adhesive member disposed on a first surface of the protective film, and a second adhesive member disposed on a second surface of the protective film.

7. The display device of claim 1, further comprising:
   a main display surface; and
   a sub display surface inclined to the main display surface, wherein a flat main portion of the main portion is disposed on the main display surface, and a curved main portion of the main portion is disposed on the sub display surface.

8. The display device of claim 1, wherein the display panel comprises a base substrate, an active element layer, and a thin-film encapsulation layer.

\* \* \* \* \*